(12) United States Patent
Ishigami et al.

(10) Patent No.: US 11,839,019 B2
(45) Date of Patent: Dec. 5, 2023

(54) COMMUNICATION MODULE AND ELECTRONIC DEVICE

(71) Applicant: CANON KABUSHIKI KAISHA, Tokyo (JP)

(72) Inventors: Tomohisa Ishigami, Kanagawa (JP); Makoto Aoki, Tokyo (JP); Yuya Okada, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 17/668,461

(22) Filed: Feb. 10, 2022

(65) Prior Publication Data
US 2022/0272833 A1    Aug. 25, 2022

(30) Foreign Application Priority Data

Feb. 19, 2021  (JP) ................................. 2021-025057
Jan. 27, 2022  (JP) ................................. 2022-010621

(51) Int. Cl.
| | |
|---|---|
| H05K 1/02 | (2006.01) |
| H05K 1/18 | (2006.01) |
| H01L 27/146 | (2006.01) |
| H04N 23/51 | (2023.01) |
| H04N 23/54 | (2023.01) |
| H04N 23/57 | (2023.01) |

(52) U.S. Cl.
CPC ..... H05K 1/0219 (2013.01); H01L 27/14636 (2013.01); H04N 23/51 (2023.01); H04N 23/54 (2023.01); H04N 23/57 (2023.01); H05K 1/181 (2013.01); H05K 1/189 (2013.01)

(58) Field of Classification Search
CPC ....... H05K 1/0219; H05K 1/181; H05K 1/189
USPC ........................................................ 174/250
See application file for complete search history.

(56) References Cited

U.S. PATENT DOCUMENTS

| | | |
|---|---|---|
| 4,842,408 A | 6/1989 | Yoshii et al. |
| 2019/0267339 A1* | 8/2019 | Murase .................. H01L 25/16 |
| 2020/0236261 A1 | 7/2020 | Okada et al. |
| 2020/0315016 A1* | 10/2020 | Tsuboi .................. H05K 1/111 |
| 2021/0320142 A1 | 10/2021 | Noguchi et al. |

FOREIGN PATENT DOCUMENTS

JP    2007-243091 A    9/2007

OTHER PUBLICATIONS

Co-pending U.S. Appl. No. 17/725,803, filed Apr. 21, 2022.

* cited by examiner

*Primary Examiner* — Andargie M Aychillhum
(74) *Attorney, Agent, or Firm* — Venable LLP

(57) ABSTRACT

A communication module includes a first wiring board including a plurality of first signal lines and a first ground line, and a second wiring board including a first layer and a second layer. The first layer includes a plurality of second signal lines. The second layer includes a shielding member. The communication module includes a plurality of first connection members via which the plurality of first signal lines are electrically connected to the plurality of second signal lines, and at least one conductive member provided between the first ground line and the shielding member. The at least one conductive member is provided so as to overlap with at least one second signal line among the plurality of second signal lines as viewed in a direction perpendicular to a main surface of the first wiring board.

20 Claims, 19 Drawing Sheets

COMMUNICATION MODULE AND ELECTRONIC DEVICE

BACKGROUND OF THE INVENTION

Field of the Invention

The present invention relates to a technique for addressing noises.

Description of the Related Art

An electronic device such as a digital multifunctional apparatus or a digital camera includes a communication module including two electronic units that perform data communication using digital signals. A current of communicated digital signals flows in a signal line used for data communication between the two electronic units. When a current flows in the signal line, a radiated noise such as an electric field noise can be generated. When the radiated noise interferes with a part in the electronic device, an erroneous operation can occur in the part or another part via the part.

Meanwhile, Japanese Patent Laid-Open No. 2007-243091 discloses, to address noises, exposing part of a ground line of a flexible wiring board from an insulating material and electrically connecting the part of the ground line to a conductor.

However, even if a measure to address noises is taken as in Japanese Patent Laid-Open No. 2007-243091, the generation of a radiated noise from the communication module has been inevitable, and there has been a demand to further reduce the radiated noise.

SUMMARY OF THE INVENTION

According to one aspect of the present invention, a communication module includes a first wiring board including a plurality of first signal lines and a first ground line, and a second wiring board including a first layer and a second layer. The first layer includes a plurality of second signal lines. The second layer includes a shielding member. A communication module includes a plurality of first connection members via which the plurality of first signal lines are electrically connected to the plurality of second signal lines, and at least one conductive member provided between the first ground line and the shielding member. The at least one conductive member is provided so as to overlap with at least one second signal line among the plurality of second signal lines as viewed in a direction perpendicular to a main surface of the first wiring board.

Further features of the present invention will become apparent from the following description of exemplary embodiments with reference to the attached drawings.

DESCRIPTION OF THE EMBODIMENTS

Embodiments of the present invention will be described in detail below with reference to drawings.

First Embodiment

Figure 1A:
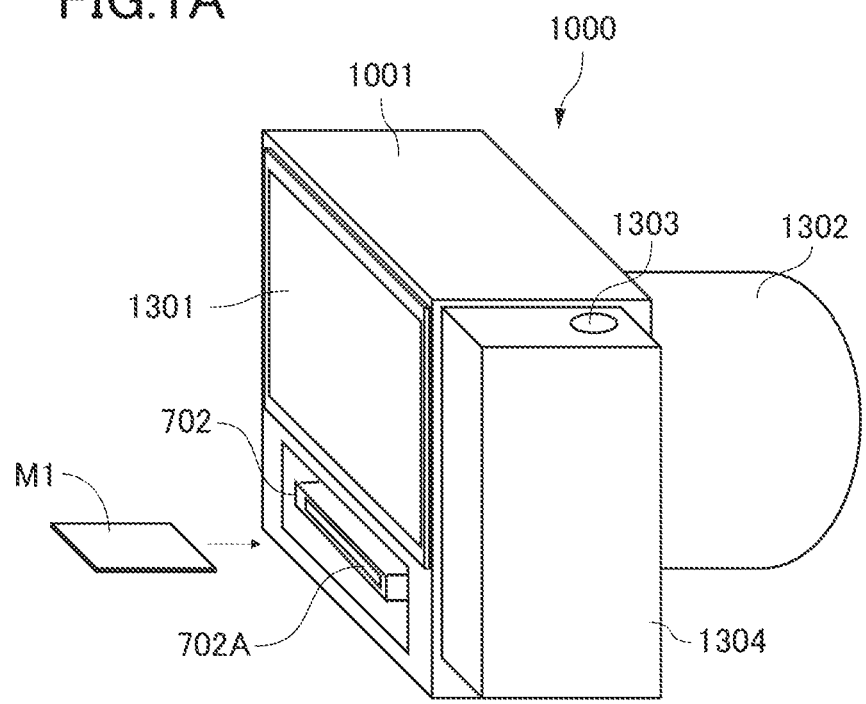
FIG. 1A is a perspective view of an image pickup apparatus serving as an example of an electronic device according to a first embodiment.
Figure 1B:
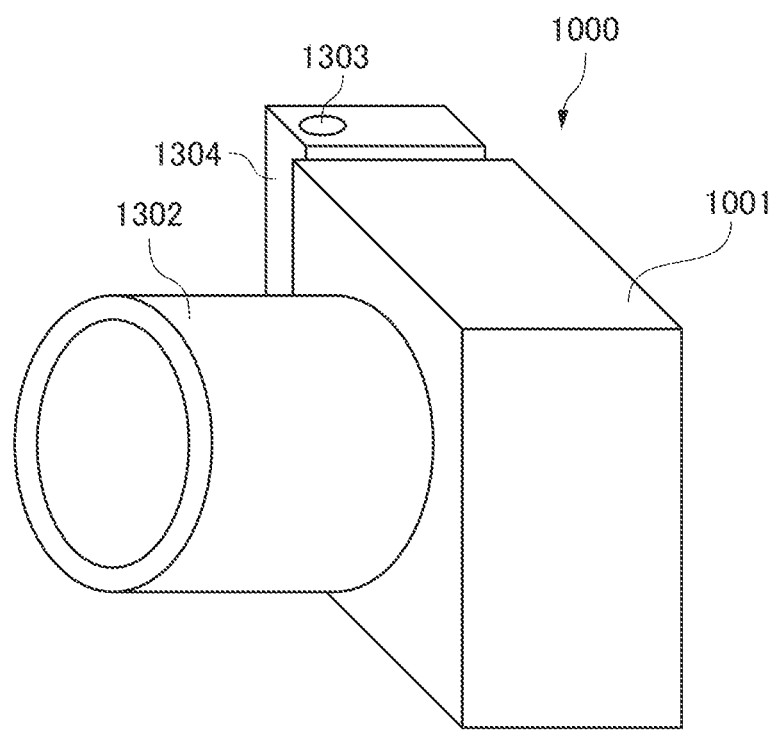
FIG. 1B is a perspective view of the image pickup apparatus serving as an example of an electronic device according to the first embodiment.

FIGS. 1A and 1B are each a perspective view of an image pickup apparatus 1000 serving as an example of an electronic device according to a first embodiment. FIG. 1A is a perspective view of the image pickup apparatus 1000 in which the image pickup apparatus 1000 is viewed from a liquid crystal screen 1301 side. FIG. 1B is a perspective view of the image pickup apparatus 1000 in which the image pickup apparatus 1000 is viewed from a lens barrel 1302 side. The image pickup apparatus 1000 is a digital camera, and has a function of capturing a still image and/or a moving image. The image pickup apparatus 1000 includes a casing 1001 that is an exterior case, the liquid crystal screen 1301 provided in the casing 1001, and a grip 1304 provided on the casing 1001. The grip 1304 is provided with a shutter button 1303. The lens barrel 1302 is attachable to and detachable from the casing 1001.

A memory connector 702 including a slot 702A is disposed inside the casing 1001. A memory card M1 that is a memory such as a secure digital card: SD card or a compact flash card: CF card is attachable to and detachable from the slot 702A of the memory connector 702. By detaching an unillustrated lid from the casing 1001, the slot 702A of the memory connector 702 is exposed to the outside of the casing 1001. By inserting the memory card M1 in the slot 702A, image data obtained by image capturing can be written into the memory card M1, and image data written into the memory card M1 can be read out.

Figure 2A:
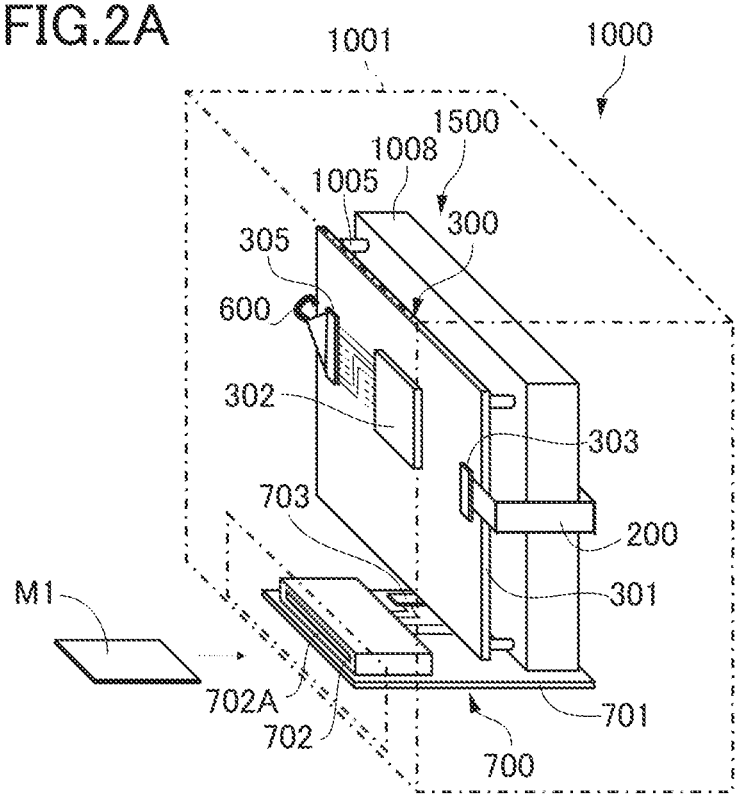
FIG. 2A is a perspective view of an apparatus body of the image pickup apparatus according to the first embodiment.
Figure 2B:
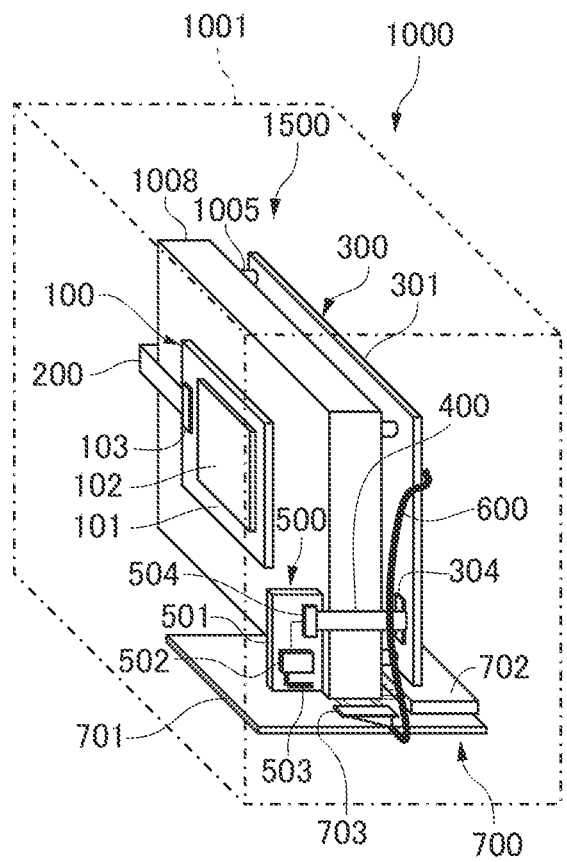
FIG. 2B is a perspective view of the apparatus body of the image pickup apparatus according to the first embodiment.
Figure 3:
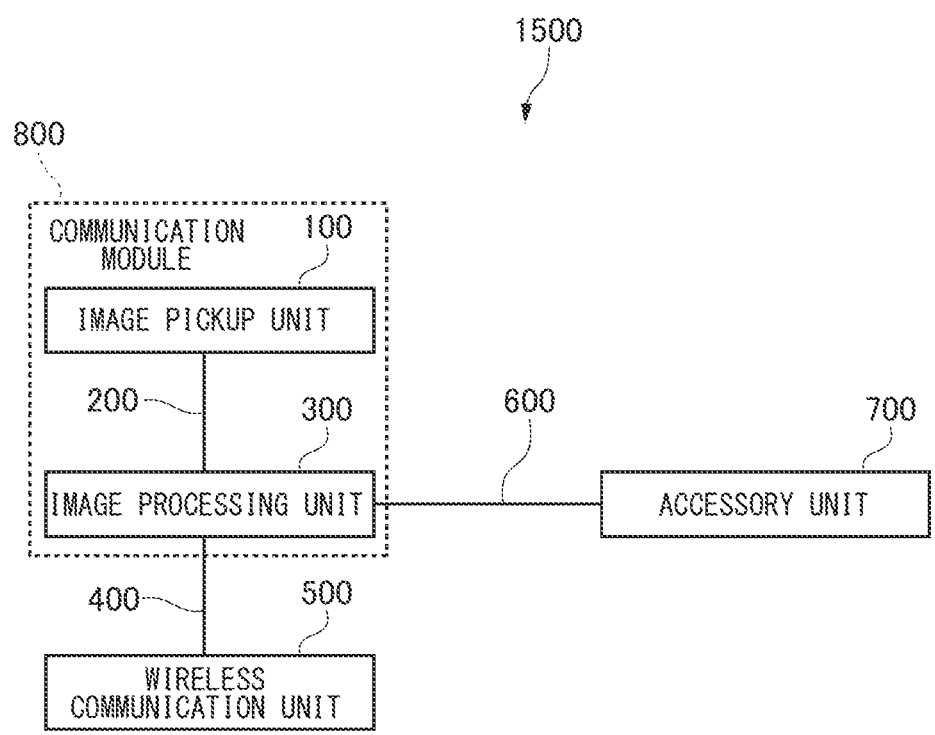
FIG. 3 is a block diagram of the apparatus body of the image pickup apparatus according to the first embodiment.

FIGS. 2A and 2B are each a perspective view of an apparatus body 1500, which is an internal structure disposed inside the casing 1001 of the image pickup apparatus 1000 according to the first embodiment. FIG. 3 is a block diagram of the apparatus body 1500 according to the first embodiment. The image pickup apparatus 1000 includes the casing 1001, and the apparatus body 1500 disposed inside the casing 1001. FIG. 2A is a perspective view of the apparatus body 1500 as viewed in the same direction as in FIG. 1A, and FIG. 2B is a perspective view of the apparatus body 1500 as viewed in the same direction as in FIG. 1B.

The apparatus body 1500 includes an image pickup unit 100, an image processing unit 300, a wireless communication unit 500, and an accessory unit 700. The image processing unit 300 is mutually communicably and electrically connected to the image pickup unit 100, the wireless communication unit 500, and the accessory unit 700.

A support member 1008 formed from resin or metal is disposed inside the casing 1001, and the image pickup unit 100, the image processing unit 300, the wireless communication unit 500, and the accessory unit 700 are supported by the support member 1008. The image pickup unit 100 is disposed on the lens barrel 1302 side illustrated in FIG. 1B with respect to the support member 1008. The image processing unit 300 is fixed to the support member 1008 via a fixing member 1005 such as a screw.

The image pickup unit 100 includes a rigid wiring board 101 serving as an example of a first wiring board, an image sensor 102 mounted on the rigid wiring board 101, and a connector 103 mounted on the rigid wiring board 101. The rigid wiring board 101 is a printed wiring board, that is, a rigid printed wiring board. The image sensor 102 is a semiconductor device serving as an example of an electronic part. The image sensor 102 is an image sensor such as a complementary metal oxide semiconductor image sensor: CMOS image sensor, or a charge-coupled device image sensor: CCD image sensor. The image sensor 102 photoelectrically converts an optical image formed thereon, and outputs a data signal that is a digital signal indicating a captured image. The connector 103 is electrically connected to the image sensor 102 via wiring of the rigid wiring board 101.

The image processing unit 300 includes a rigid wiring board 301 serving as an example of a wiring board, and an image processing integrated circuit: image processing IC 302 mounted on the rigid wiring board 301. The rigid wiring board 301 is a printed wiring board, that is, a rigid printed wiring board. The image processing IC 302 is a semiconductor device serving as an example of an electronic part. In addition, the image processing unit 300 includes connectors 303, 304, and 305 that are mounted on the rigid wiring board 301 and electrically connected to the image processing IC 302 via wiring of the rigid wiring board 301.

The wireless communication unit 500 is capable of wirelessly communicating with an external device such as a personal computer: PC, or a wireless router. The wireless communication unit 500 includes a rigid wiring board 501 serving as an example of a wiring board, and a wireless communication IC 502 mounted on the rigid wiring board 501. The rigid wiring board 501 is a printed wiring board, that is, a rigid printed wiring board. The rigid wiring board 501 includes an antenna 503 constituted by a conductor pattern and the like. In addition, the wireless communication unit 500 includes a connector 504 that is mounted on the rigid wiring board 501 and electrically connected to the wireless communication IC 502 via wiring of the rigid wiring board 501.

The wireless communication IC 502 is an IC capable of transmission and/or reception of data to and/or from an external device via the antenna 503. For example, the wireless communication IC 502 modulates a digital signal indicating image data, and transmits the modulated digital signal from the antenna 503 as a radio wave of a communication frequency conforming to wireless communication standards. In addition, for example, the wireless communication IC 502 demodulates a radio wave received by the antenna 503 into a digital signal indicating image data. The communication frequency is a frequency of a GHz band that is a frequency equal to or higher than 1 GHz, for example, a frequency of a 2 GHz band or a 5 GHz band. Here, the 2 GHz band indicates a frequency range from 2.4 GHz to 2.5 GHz. In addition, the 5 GHz band indicates a frequency range from 5.2 GHz to 5.8 GHz.

The wireless communication unit 500, that is, the wireless communication IC 502 is configured to wirelessly communicate with an external device in accordance with a wireless communication standard. The wireless communication standard is, for example, the standard of Wi-Fi (registered trademark), or the standard of Bluetooth (registered trademark).

The accessory unit 700 includes a rigid wiring board 701 serving as an example of a wiring board, and the memory connector 702 described above mounted on the rigid wiring board 701. The rigid wiring board 701 is a printed wiring board, that is, a rigid printed wiring board. In addition, the accessory unit 700 includes a connector 703 mounted on the rigid wiring board 701 and electrically connected to the memory connector 702 via wiring of the rigid wiring board 701.

The image pickup unit 100 and the image processing unit 300 are mutually communicably connected to each other via the flexible wiring board 200 serving as an example of a second wiring board. The flexible wiring board 200 is a printed wiring board, that is, a flexible printed wiring board. The image processing unit 300 and the wireless communication unit 500 are mutually communicably connected to each other via a harness 400. The image processing unit 300 and the accessory unit 700 are mutually communicably connected to each other via a harness 600. A first end of the flexible wiring board 200 in the longitudinal direction is attached to the connector 103 of the image pickup unit 100, and a second end of the flexible wiring board 200 in the longitudinal direction is attached to the connector 303 of the image processing unit 300. A first end of the harness 400 in the longitudinal direction is attached to the connector 304 of the image processing unit 300, and a second end of the harness 400 in the longitudinal direction is attached to the connector 504 of the wireless communication unit 500. A first end of the harness 600 in the longitudinal direction is attached to the connector 305 of the image processing unit 300, and a second end of the harness 600 in the longitudinal direction is attached to the connector 703 of the accessory unit 700. To be noted, the harness 400 may be a flexible printed wiring board, and the harness 600 may be a flexible printed wiring board.

In the first embodiment, the communication module 800 includes the image pickup unit 100, the image processing unit 300, and the flexible wiring board 200 as illustrated in FIG. 3. The image pickup unit 100 is an example of a first electronic unit, and the image processing unit 300 is an example of a second electronic unit. The image pickup unit 100 and the image processing unit 300 are connected to each other via the flexible wiring board 200 so as to perform data communication using digital signals. For example, the image sensor 102 of the image pickup unit 100 is capable of transmitting a digital signal that is a data signal to the image processing IC 302 of the image processing unit 300 via the flexible wiring board 200.

The data signal communicated between the image pickup unit 100 and the image processing unit 300 via the flexible wiring board 200 is a digital signal of a transmission rate of 1 Gbps or more. The data signal is a digital signal of image data in the first embodiment. The digital signal communicated via the flexible wiring board 200 may be either a single end signal or a differential signal, but the differential signal that enables communication at a higher speed than the single end signal is more preferable. In the first embodiment, the digital signal transmitted from the image pickup unit 100 to the image processing unit 300 via the flexible wiring board 200 is a differential signal.

The image processing IC 302 is capable of obtaining a digital signal that is an electric signal indicating a captured image from the image sensor 102 and performing image processing. In addition, the image processing IC 302 is capable of performing processing of writing image data into the memory card M1 and processing of reading out image data from the memory card M1. Further, the image processing IC 302 is capable of performing processing of obtaining image data from the wireless communication IC 502 and performing processing of transmitting image data to the wireless communication IC 502.

The flexible wiring board 200 includes a signal line used for communication of a data signal, that is, includes a data signal line. Further, the flexible wiring board 200 may include wiring other than the data signal line, for example, wiring such as a control line, a power supply line, and a ground line. To be noted, a different signal may be added to the data signal communicated through the data signal line. For example, the different signal is a synchronization signal.

Figure 4:
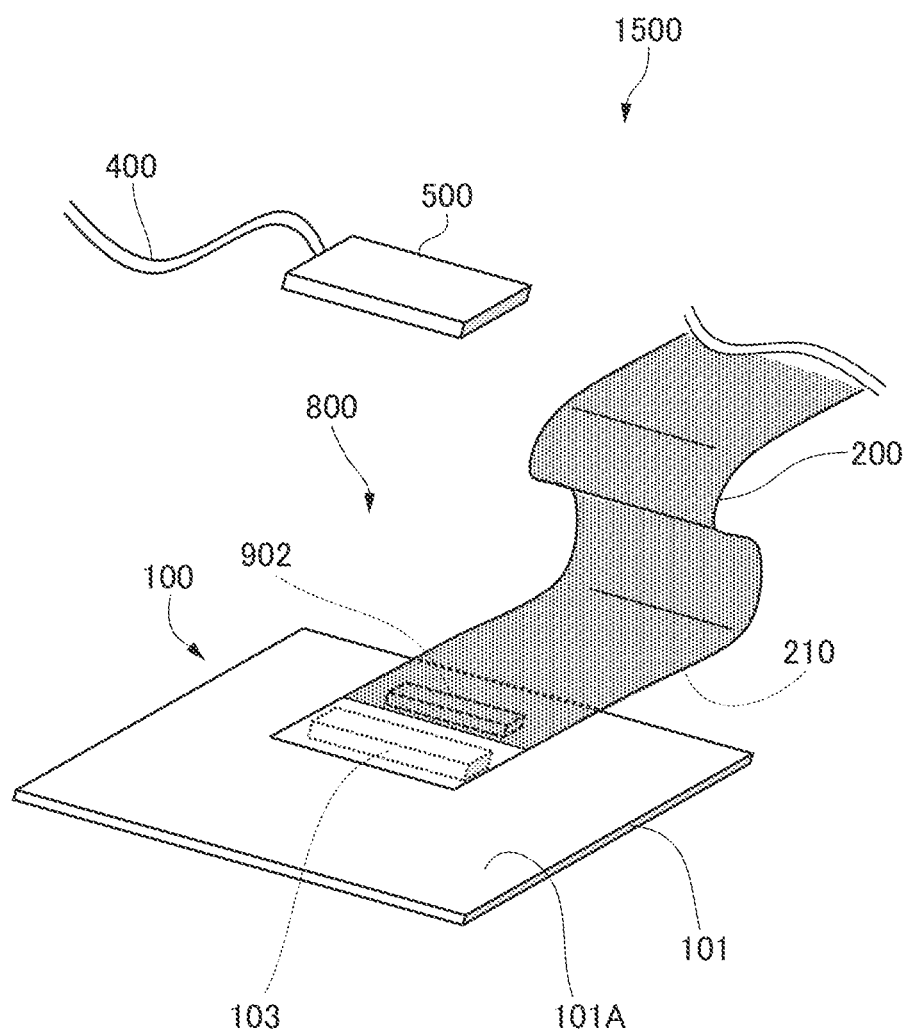
FIG. 4 is an explanatory diagram illustrating a schematic configuration of part of the apparatus body of the image pickup apparatus according to the first embodiment.

FIG. 4 is an explanatory diagram illustrating a schematic configuration of part of the apparatus body 1500 according to the first embodiment. The flexible wiring board 200 includes a shielding member 210 to reduce noise radiation from the flexible wiring board 200 or reduce superimposition of an external noise on the digital signal when communicating the digital signal via the flexible wiring board 200. The image sensor 102 illustrated in FIG. 2B and the connector 103 are mounted on a main surface 101A of the rigid wiring board 101. The flexible wiring board 200 is attached to the connector 103. Here, a direction perpendicular to the main surface 101A is set as a Z direction. Directions intersecting with the Z direction are set as an X direction and a Y direction. The X direction and the Y direction are preferably perpendicular to the Z direction. In addition, the Y direction is a direction intersecting with the X direction, and is preferably perpendicular to the X direction.

Figure 5A:
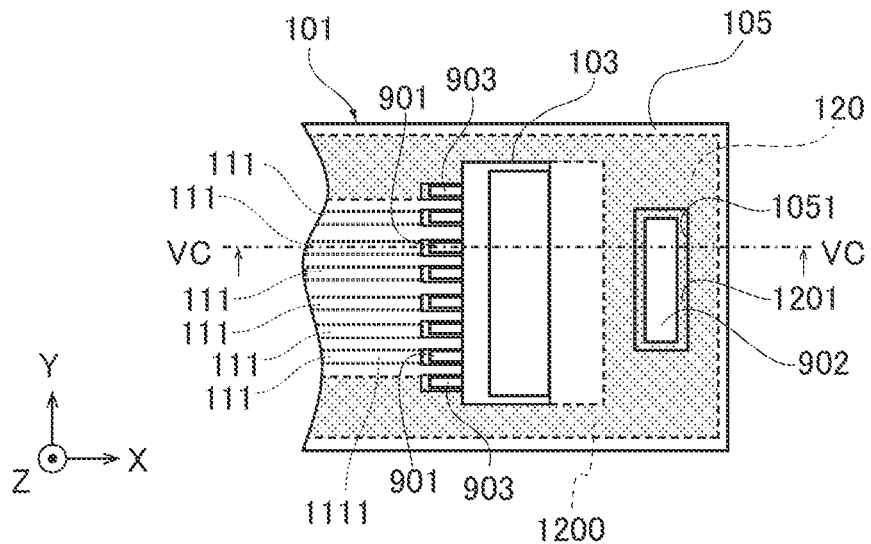
FIG. 5A is a plan view of part of a rigid wiring board and a connection structure according to the first embodiment.
Figure 5B:
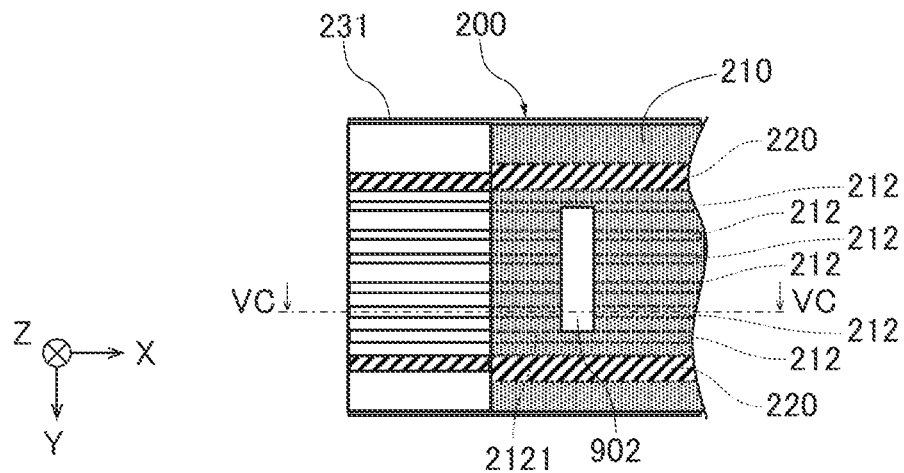
FIG. 5B is a plan view of part of a flexible wiring board and the connection structure according to the first embodiment.
Figure 5C:
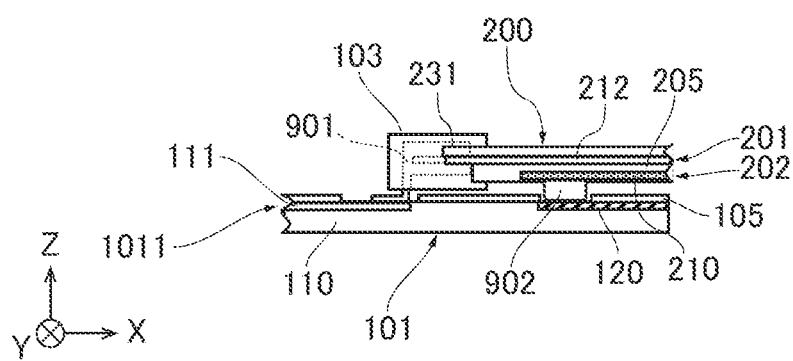
FIG. 5C is a section view of the rigid wiring board, the flexible wiring board, and the connection structure according to the first embodiment.

FIG. 5A is a plan view of part of the rigid wiring board 101 and a connection structure according to the first embodiment. FIG. 5B is a plan view of part of the flexible wiring board 200 and the connection structure according to the first embodiment. FIG. 5C is a section view of the rigid wiring board 101, the flexible wiring board 200, and the connection structure according to the first embodiment. FIG. 5C schematically illustrates a cross-section taken along a line VC-VC in FIGS. 5A and 5B.

The rigid wiring board 101 is a printed wiring board including at least one conductor layer, which is a conductor layer 1011 in the first embodiment. The conductor layer is a layer in which a conductor pattern is disposed. The conductor layer 1011 is an outer layer, that is, a surface layer. The conductor layer 1011 corresponds to the main surface 101A illustrated in FIG. 4.

A solder resist 105 is disposed on the conductor layer 1011. The rigid wiring board 101 includes an insulator 110 that is an insulating substrate, a plurality of signal lines 111, and a ground line 120. In the first embodiment, six signal lines 111 are provided. The signal lines 111 and the ground line 120 are each formed from a conductive material, that is, metal. Part or all of the signal lines 111 each are disposed in the conductor layer 1011. In addition, part or the entirety of the ground line 120 is disposed in the conductor layer 1011. A ground potential serving as a standard for each part is applied to the ground line 120. For example, a negative electrode of an unillustrated battery is electrically connected to the ground line 120.

The signal lines 111 each serve as a first signal line. The signal lines 111 each include a conductor pattern 1111 disposed in the conductor layer 1011 and extending in a longitudinal direction serving as a wiring direction. The conductor pattern 1111 serves as an example of a first conductor pattern and an example of a first signal pattern. The ground line 120 serves as a first ground line. The ground line 120 includes a solid conductor pattern 1200 disposed in the conductor layer 1011. The conductor pattern 1200 serves as an example of a first ground pattern. Among the plurality of signal lines 111, two adjacent signal lines 111 constitute a differential wire pair serving as a communication path for communicating a differential signal. In the first embodiment, six signal lines 111 constitute three differential wire pairs.

An end portion 231 of the flexible wiring board 200 in the X direction in the example of FIGS. 5B and 5C serves as a first end of the flexible wiring board 200 in the longitudinal direction. The end portion 231 of the flexible wiring board 200 is attached to the connector 103. The flexible wiring board 200 is a two-layer flexible printed wiring board including two conductor layers 201 and 202 arranged at an interval in the thickness direction, which is the Z direction in the example of FIG. 2C, with an insulator 205 therebetween. That is, the conductor layer 201 and the conductor layer 202 are arranged adjacent to each other in the Z direction with the insulator 205 therebetween.

The conductor layer 201 is an example of a first layer, and the conductor layer 202 is an example of a second layer. The conductor layer 202 is a different conductor layer different from the conductor layer 201. The flexible wiring board 200 includes a plurality of signal lines 212 and at least one ground line that are disposed in the conductor layer 201. In the first embodiment, the at least one ground line is a plurality of ground lines 220. In addition, in the first embodiment, the number of the signal lines 212 is 6, which is equal to the number of the signal lines 111. The six signal lines 212 constitute three differential wire pairs. The number of the ground lines 220 is 2. The signal lines 212 and the ground lines 220 are each formed from a conductive material, that is, metal.

The signal lines 212 each serve as a second signal line. The signal lines 212 each serve as an example of a conductor pattern extending in the longitudinal direction and an example of a second signal pattern. The ground lines 220 each serve as a second ground line. The ground lines 220 each serve as an example of a conductor pattern extending in the longitudinal direction and an example of a second ground pattern.

The plurality of signal lines 212 and the plurality of ground lines 220 are arranged at intervals in a predetermined direction, which is the Y direction in the example illustrated in FIG. 5B. In addition, the predetermined direction also serves as a width direction of the flexible wiring board 200, that is, a width direction of each of the plurality of signal lines 212. Therefore, the length of the signal line 212 in the Y direction can be also referred to as the width of the signal lines 212 in the Y direction.

In addition, the plurality of signal lines 212 and the plurality of ground lines 220 are formed to extend in the longitudinal direction, which is the X direction in the example illustrated in FIG. 5B. The six signal lines 212 are arranged adjacent to each other at intervals in the Y direction. The two ground lines 220 are arranged at intervals from the two outermost signal lines 212 at respective ends in the Y direction such that the six signal lines 212 are interposed therebetween in the Y direction. To be noted, the arrangement of the signal lines 212 and the ground lines 220 is not limited to this. For example, a ground line may be disposed between a plurality of signal lines 212 such as between a differential wire pair and another differential wire pair. In this case, the differential wire pair is a pair of signal lines 212 adjacent to each other.

A shielding member 210 is disposed in the conductor layer 202. The shielding member 210 is a conductor pattern formed from a conductive material, and is disposed in the conductor layer 202 so as to be exposed to the outside. In the end portion 231 of the flexible wiring board 200, part of each of the signal lines 212 and part of each of the ground lines 220 are exposed to the outside in such a manner as to be attachable to the connector 103. That is, the shielding member 210 is not disposed on the wiring at the end portion 231. To be noted, in the flexible wiring board 200, an end portion on the opposite side to the end portion 231, that is, an end portion to be attached to the connector 303 illustrated in FIG. 2A is configured in a similar manner to the end portion 231.

The connector 103 mounted on the rigid wiring board 101 includes a plurality of signal terminals 901 and a plurality of ground terminals 903. The plurality of signal terminals 901 and the plurality of ground terminals 903 are arranged in a single line in the Y direction at intervals.

The signal terminals 901 each serve as an example of a first connection member. The ground terminals 903 each serve as an example of a ground connection member and an example of a second connection member. The plurality of signal terminals 901 are respectively electrically and mechanically connected to the plurality of signal lines 111 via a bonding material such as solder. The plurality of ground terminals 903 are electrically and mechanically connected together to the ground line 120 via a bonding material such as solder. When the end portion 231 of the flexible wiring board 200 is attached to the connector 103, the plurality of signal lines 111 of the rigid wiring board 101 and the plurality of signal lines 212 of the flexible wiring board 200 are electrically connected to each other at the plurality of signal terminals 901 of the connector 103. In addition, when the end portion 231 of the flexible wiring board 200 is attached to the connector 103, the ground line 120 of the rigid wiring board 101 and the plurality of ground lines 220 of the flexible wiring board 200 are electrically connected to each other at the plurality of ground terminals 903 of the connector 103. In the first embodiment; since the flexible wiring board 200 is attachable to and detachable from the connector 103, the flexible wiring board 200 is detachably connected to the rigid wiring board 101 via the connector 103 including the plurality of signal terminals 901.

The data signal indicating an image generated by the image sensor 102 is transmitted to the image processing IC 302 as a differential signal via a pair of signal lines 111, a pair of signal terminals 901, and a pair of signal lines 212.

Here, a return current of a current of the digital signal flowing in each signal line 212 flows in the shielding member 210 of the flexible wiring board 200. The signal lines 212 each include a portion 2121 opposing the shielding member 210 in the Z direction serving as a thickness direction. The portion 2121 is a portion different from the two end portions. One of the two end portions is the end portion 231. The portion 2121 of each of the signal lines 212 is a portion covered by the shielding member 210 in FIG. 5B. As a result of the current of the digital signal flowing in the portion 2121 of each of the signal lines 212 and the return current flowing in the shielding member 210 being in the proximity to each other, electric fields generated by the currents cancel each other, and thus a radiated noise from the signal lines 212 can be effectively reduced.

Meanwhile, the shielding member 210 of the flexible wiring board 200 is not provided at the connector 103. Therefore, in the first embodiment, the communication module 800 includes at least one conductive member disposed between the rigid wiring board 101 and the flexible wiring board 200 to secure the path for the return current flowing in the shielding member 210 of the flexible wiring board 200. In the first embodiment, the at least one conductive member is the one connection member 902. The material of the connection member 902 is a material having conductivity, that is, metal. For example, a metal gasket may be used as the connection member 902. The connection member 902 electrically interconnects the ground line 120 of the rigid wiring board 101 and the shielding member 210 of the flexible wiring board 200. To distribute the return current in the connector 103 to the connection member 902, the connection member 902 is preferably as close to the connector 103 as possible.

An opening portion 1051 is provided in the solder resist 105 of the rigid wiring board 101, and the portion 1201 of the ground line 120 is exposed through the opening portion 1051. The connection member 902 is in contact with the portion 1201 of the ground line 120 through the opening portion 1051 of the solder resist 105. In addition, the flexible wiring board 200 is attached to the connector 103 such that the shielding member 210 opposes the portion 1201 of the ground line 120 of the rigid wiring board 101. The connection member 902 provided on the portion 1201 of the ground line 120 is in contact with the shielding member 210.

At least one of the ground line 120 of the rigid wiring board 101 and the shielding member 210 of the flexible wiring board 200 is preferably connected to the connection member 902 by a conductive double-sided tape. In the case where one of the ground line 120 and the shielding member 210 is connected to the connection member 902 by a conductive double-sided tape, the other of the ground line 120 and the shielding member 210 may be bonded to the connection member 902 via a bonding material such as solder. In addition, the connection member 902 itself may be a conductive double-sided tape.

Figure 6A:
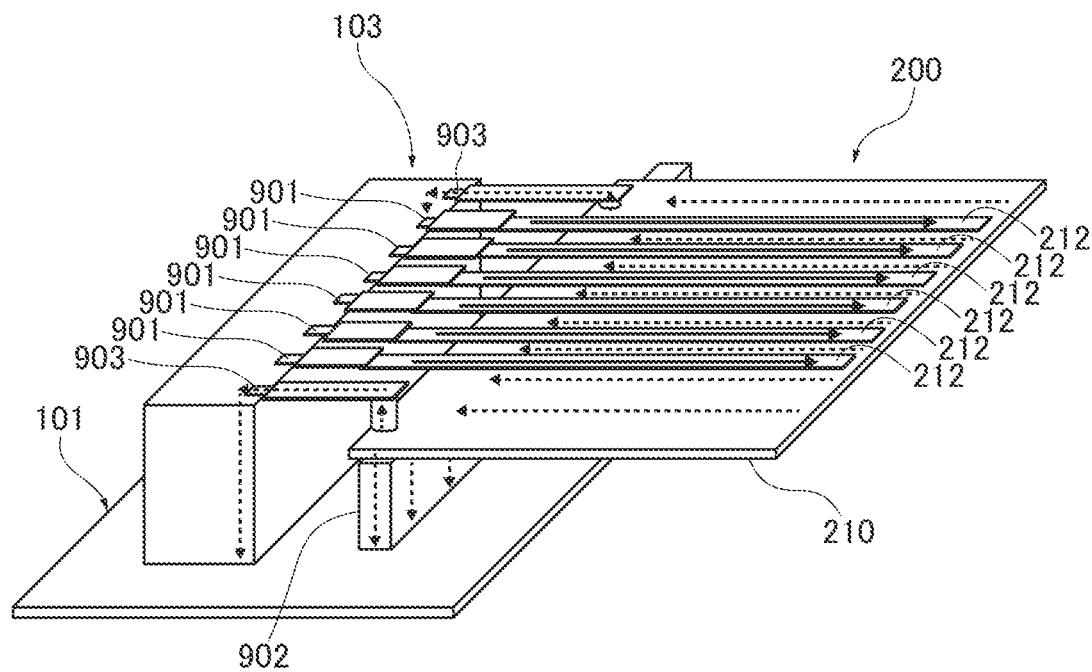
FIG. 6A is an explanatory diagram of a flow of a return current in the first embodiment.
Figure 6B:
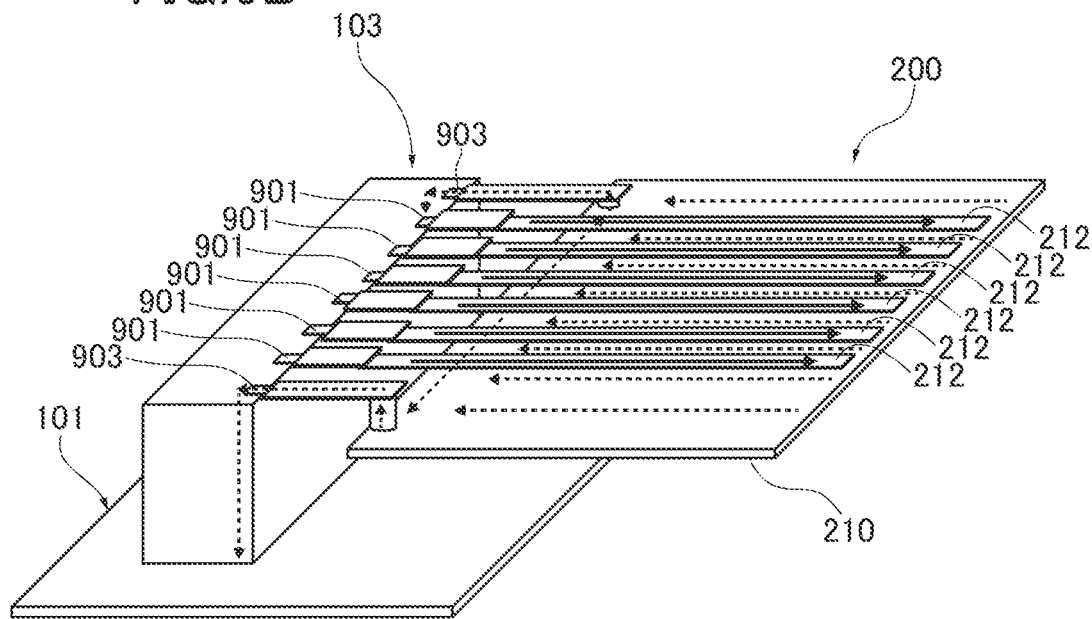
FIG. 6B is an explanatory diagram of a flow of a return current in a comparative example.

FIG. 6A is an explanatory diagram of a flow of a return current in the first embodiment. FIG. 6B is an explanatory diagram of a flow of a return current in a modification example. In the modification example illustrated in FIG. 6B, the connection member 902 illustrated in FIG. 6A is not provided. To be noted, in FIGS. 6A and 6B, illustration of the insulator 205 of the flexible wiring board 200 is omitted.

In the case where the connection member 902 is not provided as in the comparative example illustrated in FIG. 6B, the path of the return current from the shielding member 210 to the rigid wiring board 101 is only the ground terminals 903 of the connector 103. There is a tendency that the level of the conducted noise superimposed on the digital signal is higher at and near a frequency corresponding to the transmission rate of the digital signal transmitted through the flexible wiring board 200. In the flexible wiring board 200, an electric field generated by a signal current including the conducted noise and an electric field generated thereby cancel each other, and thus the radiated noise can be reduced. However, in the comparative example illustrated in FIG. 6B, the return current flowing in the shielding member 210 is concentrated in the ground terminals 903 of the connector 103. Therefore, in and near the connector 103, the cancelling effect between the electric field generated by the signal current including the conducted noise and the electric field generated by the return current thereof is lowered. Therefore, in the comparative example, there is a tendency that the level of the electric field noise radiated from the connector 103 and the surroundings thereof becomes also higher. When the electric field noise radiated from the connector 103 and the surroundings thereof interferes with the wireless communication unit 500, there is a possibility that an erroneous operation of the wireless communication unit 500 occurs. For example, in a digital signal, in the case where a common mode component of a frequency in or near the 2.4 GHz band or the 5 GHz band used in the wireless communication of the wireless communication unit 500 is generated, an electric field noise of the same frequency as the frequency of the common mode component is generated. In the case where the radiated electric field noise interferes with the wireless communication unit 500, a communication failure can occur in the wireless communication unit 500.

In the first embodiment, the connection member 902 is disposed so as to partially overlap with at least one signal line 212 among the plurality of signal lines 212 as viewed in the Z direction. As a result of this, the connection member 902 secures the path for the return current flowing from the flexible wiring board 200 and the rigid wiring board 101 as illustrated in FIG. 6A.

In the first embodiment, as viewed in the Z direction, the connection member 902 overlaps with part of at least one signal line 212 among the plurality of signal lines 212 in the X direction, and overlaps with part or entirety of at least one signal line 212 in the Y direction. In the example of FIG. 5B, the connection member 902 partially overlaps with two or more signal lines 212, specifically five signal lines 212 among the six signal lines 212 as viewed in the Z direction. More specifically, the connection member 902 overlaps with part of each of the five signal lines 212 in the X direction as viewed in the Z direction. In addition, among the five signal lines 212, the connection member 902 overlaps with the entirety of each of four signal lines 212 in the Y direction and part of one signal line 212 in the Y direction as viewed in the Z direction.

As described above, according to the first embodiment, the path for the return current flowing from the flexible wiring board 200 to the rigid wiring board 101 is secured by the connection member 902. As a result of this, the radiated noise from the connector 103 serving as a connection portion between the flexible wiring board 200 and the rigid wiring board 101 and signal lines 212 near the connector 103 can be reduced. In addition, since the radiated noise can be reduced, noise interference in the wireless communication unit 500 illustrated in FIG. 2B can be reduced, and thus wireless communication can be stably performed in the wireless communication unit 500.

To be noted, the signal terminals 901 and the connection member 902 are preferably close to each other without contact.

EXAMPLE 1

Figure 7A:
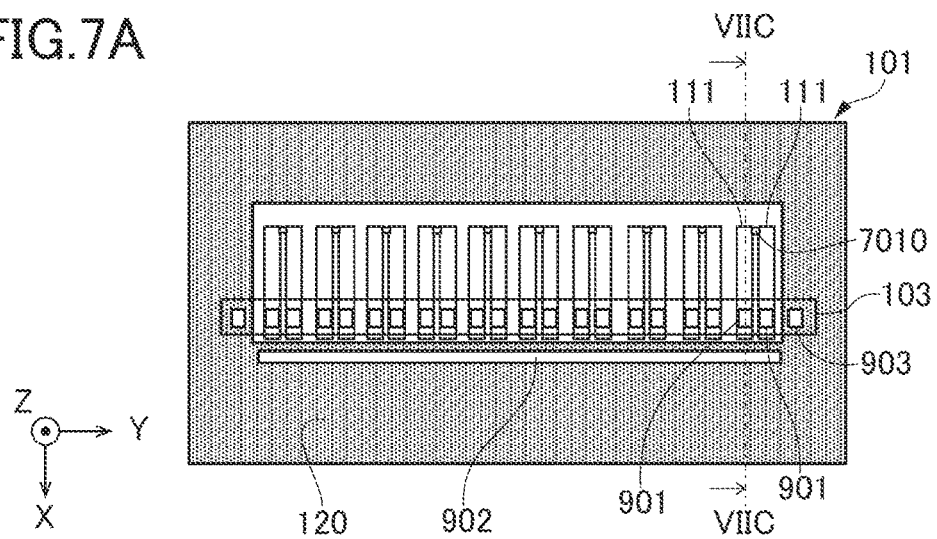
FIG. 7A is an explanatory diagram of a configuration used for simulation of Example 1.
Figure 7B:
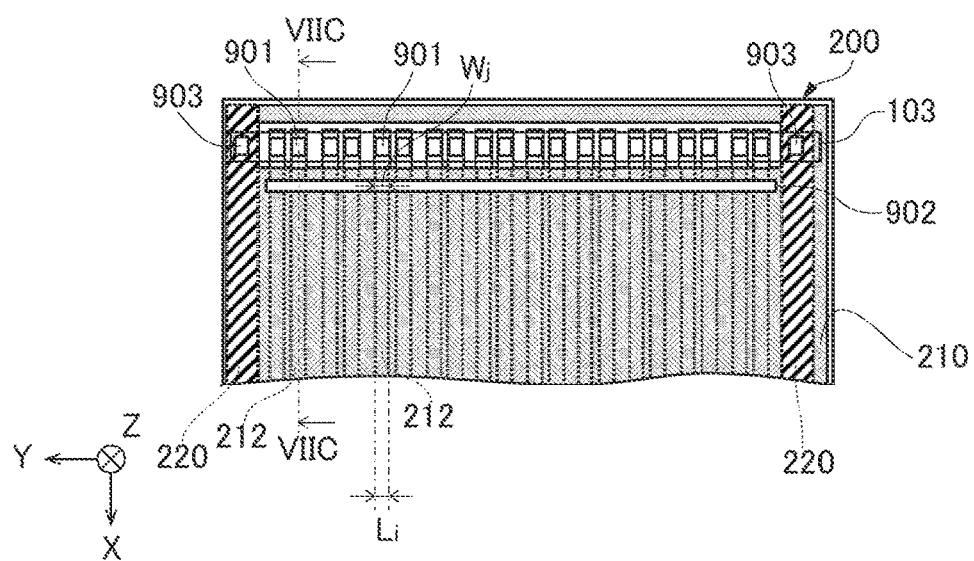
FIG. 7B is an explanatory diagram of the configuration used for simulation of Example 1.
Figure 7C:
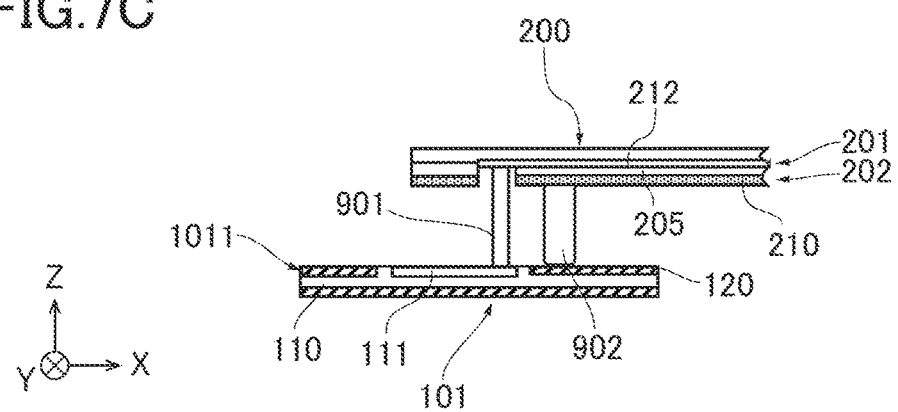
FIG. 7C is an explanatory diagram of the configuration used for simulation of Example 1.

Example 1 is an example of simulation of the communication module 800 according to the first embodiment by arithmetic calculation by a computer. In Example 1, three-dimensional electromagnetic field simulation was performed by using a computer. In the computer simulation, three-dimensional electromagnetic field simulator HFSS available from ANSYS was used. A simulation model will be described. FIGS. 7A to 7C are explanatory diagrams of a configuration used for the simulation of Example 1. FIG. 7A is a schematic plan view of the rigid wiring board 101, the connector 103, and the connection member 902. FIG. 7B is a schematic plan view of the flexible wiring board 200, the connector 103, and the connection member 902. FIG. 7C is a schematic section view taken along a line VIIC-VIIC illustrated in FIGS. 7A and 7B.

Dimensions used for the simulation will be described. The rigid wiring board 101 was a two-layer substrate having an outer shape of a width of 5.3 mm, a length of 10.35 mm, and a thickness of 0.236 mm. In addition, the dimensions of the rigid wiring board 301 illustrated in FIG. 2B that is on the receiving end of the signal transmitted from the rigid wiring board 101 was set to the same values.

The flexible wiring board 200 was a two-layer substrate having an outer shape of a width of 10.35 mm, a length of 129 mm, and a thickness of 57.5 µm. The dimensions of the signal line 212 in the conductor layer 201 were set to a width of 54 µm, a length of 129 mm, and a thickness of 6 µm.

As illustrated in FIG. 7A, the rigid wiring board 101 was set to include 20 signal lines 111 as a plurality of first signal lines. Digital signals transmitted through the signal lines 111 were set to be differential signals. Therefore, differential wire pairs through which differential signals were transmitted were each constituted by a pair of adjacent signal lines 111. In addition, to make a noise to be propagated through the differential wire pairs, a short circuit was formed at starting ends of the pair of signal lines 111 in each differential wire pair, and a power supply point 7010 of 1 W was provided at the short circuit. In the rigid wiring board 101, 10 pairs of signal lines 111, that is, 10 differential wire pairs were provided. Alternating voltages and alternating currents were applied to each signal line 111 at an increment of 0.1 GHz of frequency in the range of 0.1 to 8.0 GHz in such conditions that the power is constant at 1 W.

Similarly, as illustrated in FIG. 7B, the flexible wiring board 200 was set to include 20 signal lines 212 as a plurality of second signal lines. Differential wire pairs through which differential signals were transmitted were each constituted by a pair of adjacent signal lines 212. In the flexible wiring board 200, 10 pairs of signal lines 212, that is, 10 differential wire pairs were provided. The interval between a pair of signal lines 212 was set to 55 µm. In the flexible wiring board 200, the interval between two adjacent differential wire pairs was set to 141 µm.

In addition, the width of each ground line 220 was set to 1.2 mm. The interval between a ground line 220 and a signal line 212 adjacent to the ground line 220 in the Y direction was set to 215 µm. The thickness of the shielding member 210 in the Z direction was set to 5 µm. The ground lines 220 were arranged so as to overlap with the shielding member 210 as viewed in the Z direction, and are electrically connected to the shielding member 210 at an interval of 5 mm in the X direction.

In addition, the connector 103 was provided on the rigid wiring board 101 such that the distance between the rigid wiring board 101 and the flexible wiring board 200 in the Z direction was 95 µm. Further, the connection member 902 was provided at a position at 0.2 mm from the connector 103 in the +X direction such that the connection member 902 overlap with all the signal lines 212 in the Y direction as viewed in the Z direction. The dimensions of the connection member 902 were set to a length of 0.3 mm, a width of 5.3 mm, and a height of 0.95 mm.

The insulator 205 of the flexible wiring board 200 was set to be formed from polyimide having a relative permittivity of 3.5. The insulator 110 of the rigid wiring board 101 was set to be formed from FR4 having a relative permittivity of 4.3. The signal lines 111, the ground line 120, the signal lines 212, the ground lines 220, the signal terminals 901 and ground terminals 903 of the connector 103, and the connection member 902 were set to be formed from copper having a conductivity of $5.8 \times 10^7$ S/m.

22 measurement points were set at positions at 5 mm from the shielding member 210 in the −Z direction. The 22 measurement points were arranged at an interval of 2.5 mm from the center of the flexible wiring board 200 toward the rigid wiring board 301 illustrated in FIG. 2A in the X direction. The electric field intensity of the electric field noise at each measurement point was obtained by simulation in both cases where the connection member 902 was present and absent. Table 1 shows the maximum electric field intensity among electric field intensity obtained at the 22 measurement points for both cases where the connection member 902 was present and absent. To be noted, as an example, a value in 5.5 GHz, which is a frequency of a wireless local area network: wireless LAN, is presented as each value of electric field intensity shown in Table 1.

TABLE 1

| | WITH CONNECTION MEMBER 902 | WITHOUT CONNECTION MEMBER 902 |
|---|---|---|
| NOISE AMOUNT IN 5.5 GHz [dBV/m] | 35.4 | 43.8 |

As can be seen from Table 1, in the case where the connection member 902 is provided, the electric field intensity of the electric field noise is reduced by about 8.4 dBV/m as compared with the case where the connection member 902 is not provided. As can be seen from this, according to Example 1, the electric field noise, that is, the radiated noise can be reduced.

Next, simulation was performed by changing the width of the connection member 902 in the Y direction. The length of each signal line 212 in the Y direction, that is, the width of each signal line 212 is represented by $L_i$, where i represents a positive integer from 1 to n and n represents the total number of the signal lines 212. For example, in the case where the number of the signal lines 212 is 20, n is 20. When the total length (width) of the plurality of signal lines 212 in the Y direction is represented by $L_{sum}$, the following formula (1) holds.

$$L_{sum} = \sum_{i=1}^{n} L_i \quad (1)$$

For example, in the case where the length of each of the 20 signal lines 212 in the Y direction is uniformly L, the total length $L_{sum}$ is 20×L.

For signal lines 212 overlapping with the connection member 902 as viewed in the Z direction among the plurality of signal lines 212, the length in the Y direction, that is, the width of the part overlapping with the connection member 902 is represented by $W_j$, where j is a positive integer from 1 to m, m is the number of signal lines 212 overlapping with the connection member 902 as viewed in the Z direction among the plurality of signal lines 212, and 1≤m≤n holds. When the sum of the length in the Y direction of the part of the plurality of signal lines 212 overlapping with the connection member 902 as viewed in the Z direction is represented by $W_{sum}$, the following formula (2) holds.

$$W_{sum} = \sum_{j=1}^{m} W_j \quad (2)$$

For example, focusing on one signal line 212 overlapping with the connection member 902 as viewed in the Z direction, the length $W_j$ in the Y direction of the part of the signal line 212 overlapping with the connection member 902 is equal to or smaller than the length (width) of the signal line 212 in the Y direction.

When the ratio of the total length $W_{sum}$ to the total length $L_{sum}$ is represented by R, the following formula (3) holds.

$$R = \frac{W_{sum}}{L_{sum}} \quad (3)$$

Figure 8:
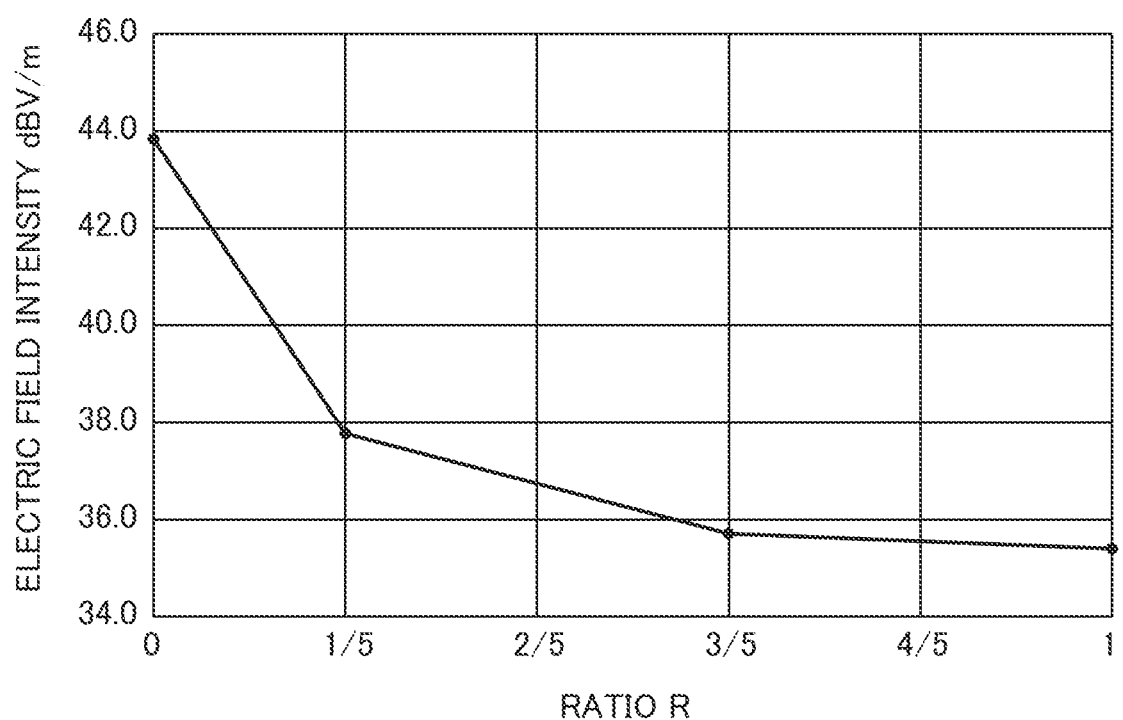
FIG. 8 is a graph illustrating a simulation result of electric field intensity of an electric field noise in Example 1.

FIG. 8 illustrates results of simulation of the electric field intensity dBV/m of the electric field noise with respect to the ratio R. FIG. 8 is a graph illustrating simulation results of the electric field intensity of the electric noise of Example 1. The horizontal axis represents the ratio R, and the vertical axis represents the electric field intensity dBV/m of the electric field noise.

As a result of simulation, it can be seen that the electric field intensity of the electric field noise decreases as the ratio R increases. Further, it can be seen that the electric field intensity of the electric field noise approximately saturates when the ratio R is 3/5 or higher. Therefore, the ratio R is preferably 3/5 or higher and 1 or lower in which the electric field noise reduction effect is high.

To be noted, in a signal line 212 overlapping with the connection member 902 as viewed in the Z direction, in the case where the length $W_j$ in the Y direction of the part overlapping with the connection member 902 is equal to the length $L_i$ in the Y direction of the signal line 212, the numerator and denominator of the formula (3) can be also each expressed by the number of signal lines. In this case, it is assumed that the signal line 212 overlapping with the connection member 902 as viewed in the Z direction partially overlaps with the connection member 902 in the X direction and entirely overlaps with the connection member 902 in the Y direction.

The total number of the plurality of signal lines 212 is n as described above, and the number of the signal lines 212 partially overlapping with the connection member 902 in the X direction as viewed in the Z direction among the plurality of signal lines 212 is m as described above. In this case, the ratio R of the number m to the total number n is expressed by m/n. Therefore, also in this case, the ratio R is preferably 3/5 to 1 in which the electric field noise reduction effect is high. For example, in the example of the 20 signal lines 212, 10 differential wire pairs are present. In the case of this example, it is preferable that 6 to 10 differential wire pairs among the 10 differential wire pairs overlap with the connection member 902 as viewed in the Z direction.

Second Embodiment

Figure 9A:
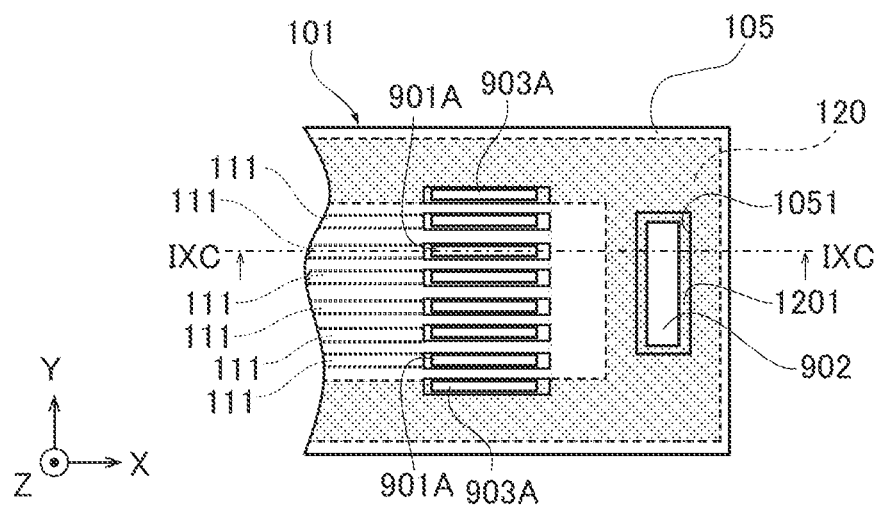
FIG. 9A is a plan view of part of a rigid wiring board and a connection structure according to a second embodiment.
Figure 9B:
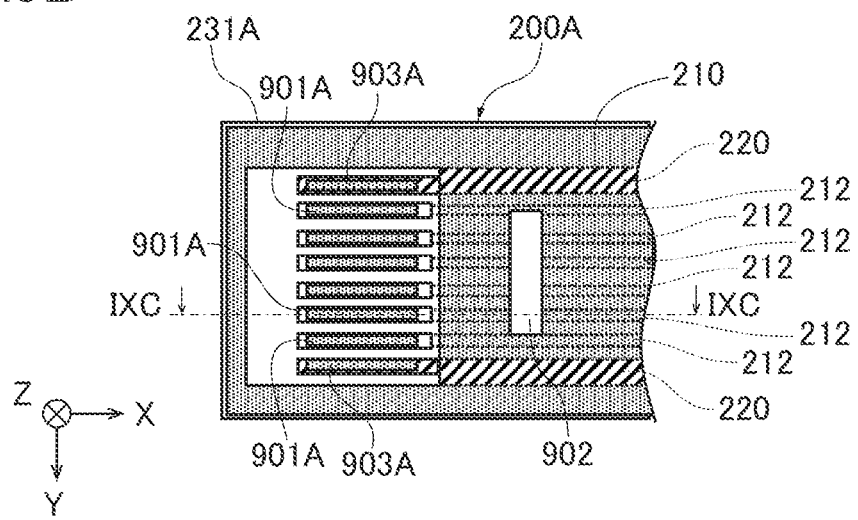
FIG. 9B is a plan view of part of a flexible wiring board and the connection structure according to the second embodiment.
Figure 9C:
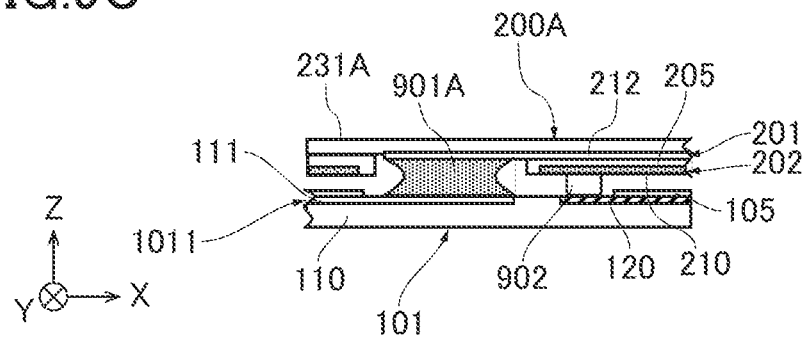
FIG. 9C is a section view of the rigid wiring board, the flexible wiring board, and the connection structure according to the second embodiment.

A second embodiment will be described. Although a case where the flexible wiring board 200 is attachable to and detachable from the connector 103 has been described in the first embodiment described above, the connection form of the flexible wiring board 200 and the rigid wiring board 101 is not limited to this. FIG. 9A is a plan view of part of the rigid wiring board 101 and a connection structure according to the second embodiment. FIG. 9B is a plan view of part of a flexible wiring board 200A and the connection structure according to the second embodiment. FIG. 9C is a section view of the rigid wiring board 101, the flexible wiring board 200A, and the connection structure according to the second embodiment FIG. 9C schematically illustrates a cross-section taken along a line IXC-IXC in FIGS. 9A and 9B. In the second embodiment, elements similar to the first embodiment are denoted by the same reference signs, and detailed description thereof will be omitted.

The rigid wiring board 101 of the second embodiment has a similar configuration to the first embodiment. The flexible wiring board 200A of the second embodiment is a flexible printed wiring board, and serves as an example of a second wiring board. An end portion 231A of the flexible wiring board 200A has a different shape from the end portion 231 of the first embodiment, and the other elements of the flexible wiring board 200A are the same as in the first embodiment. Similarly to the first embodiment, the flexible wiring board 200A is a two-layer flexible printed wiring board including the two conductor layers 201 and 202. Similarly to the first embodiment, the flexible wiring board 200A includes a plurality of signal lines 212 and a plurality of ground lines 220 disposed in the conductor layer 201, and a shielding member 210 disposed in the conductor layer 202.

In the second embodiment, the rigid wiring board 101 and the flexible wiring board 200A are directly connected to each other via a conductive bonding material such as solder instead of using the connector 103 illustrated in FIGS. 5A and 5C, and thus a connection strength is secured. Specifically, the plurality of signal lines 111 of the rigid wiring board 101 and the plurality of signal lines 212 of the flexible wiring board 200A are electrically and mechanically connected to each other via a plurality of signal bonding portions 901A. The signal bonding portions 901A each serve as an example of a first connection member. In addition, the ground line 120 of the rigid wiring board 101 and the plurality ground lines 220 of the flexible wiring board 200A are electrically and mechanically connected to each other via a plurality of ground bonding portions 903A. The ground bonding portions 903A each serve as an example of a ground connection member and an example of a second connection member. The signal bonding portions 901A and the ground bonding portions 903A are each formed from a conductive bonding material such as solder.

As described above, according to the second embodiment, the path for the return current flowing from the flexible wiring board 200A to the rigid wiring board 101 is secured by the connection member 902. As a result of this, the radiated noise from the signal bonding portions 901A serving as connection portions between the flexible wiring board 200A and the rigid wiring board 101 and signal lines 212 near the signal bonding portions 901A can be reduced. In addition, since the radiated noise can be reduced, noise interference in the wireless communication unit 500 illustrated in FIG. 2B can be reduced, and thus wireless communication can be stably performed in the wireless communication unit 500.

To be noted, the ground line 120 and the connection member 902 may be connected to each other by a double-sided conductive adhesive tape, or may be connected to each other by a conductive bonding material such as solder. Similarly, the shielding member 210 and the connection member 902 may be connected to each other by a double-sided conductive adhesive tape, or may be connected to each other by a conductive bonding material such as solder. In addition, the connection member 902 itself may be a double-sided conductive adhesive tape, or a conductive bonding material such as solder.

Third Embodiment

Figure 10A:
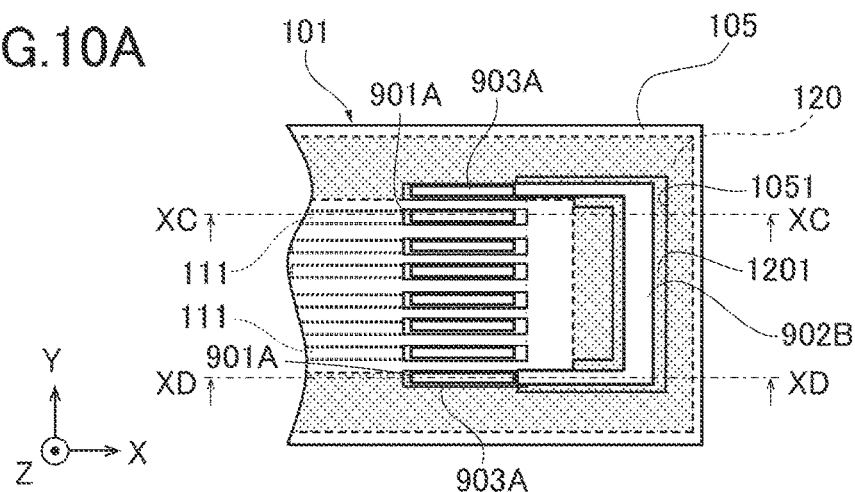
FIG. 10A is a plan view of part of a rigid wiring board and a connection structure according to a third embodiment.
Figure 10B:
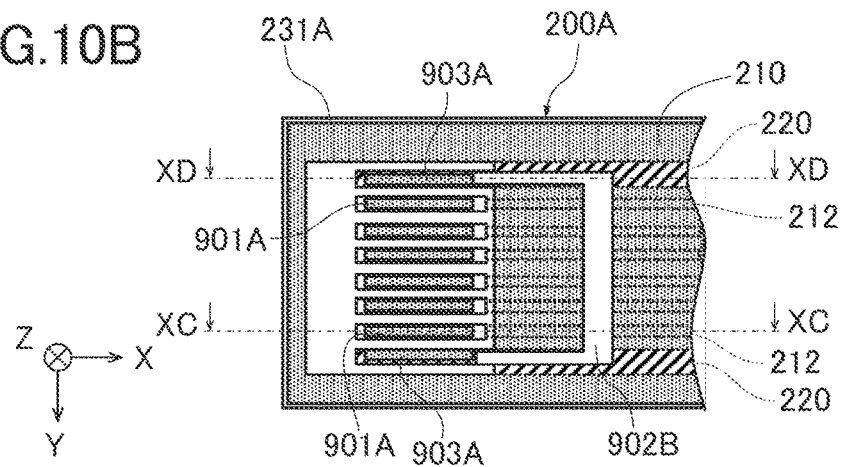
FIG. 10B is a plan view of part of a flexible wiring board and the connection structure according to the third embodiment.
Figure 10C:
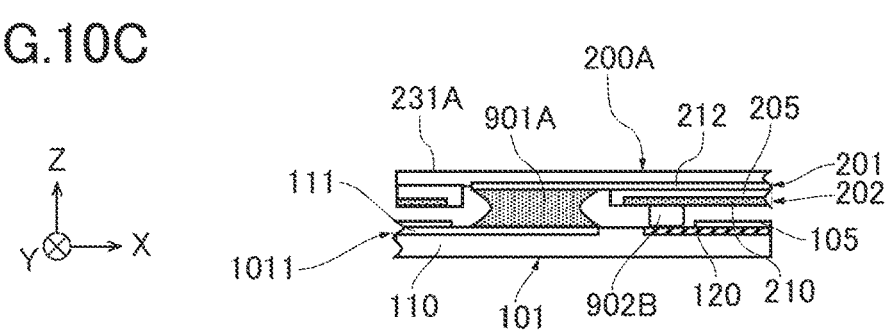
FIG. 10C is a section view of the rigid wiring board, the flexible wiring board, and the connection structure according to the third embodiment.
Figure 10D:
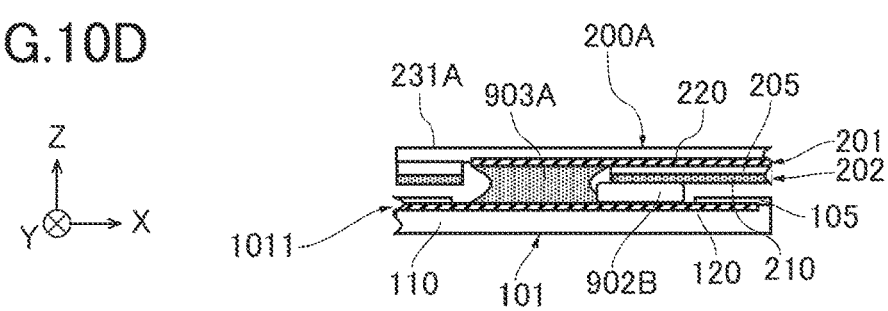
FIG. 10D is a section view of the rigid wiring board, the flexible wiring board, and the connection structure according to the third embodiment.

A third embodiment will be described. FIG. 10A is a plan view of part of the rigid wiring board 101 and a connection structure according to the third embodiment. FIG. 10B is a plan view of part of the flexible wiring board 200A and the connection structure according to the third embodiment. FIGS. 10C and 10D are each a section view of the rigid wiring board 101, the flexible wiring board 200A, and the connection structure according to the third embodiment. FIG. 10C schematically illustrates a cross-section taken along a line XC-XC in FIGS. 10A and 10B. FIG. 10D schematically illustrates a cross-section taken along a line XD-XD in FIGS. 10A and 10B. In the third embodiment, elements similar to the first embodiment and the second embodiment are denoted by the same reference signs, and detailed description thereof will be omitted.

The rigid wiring board 101 of the third embodiment has a similar configuration to the first embodiment and the second embodiment. The flexible wiring board 200A of the third embodiment is similar to the second embodiment. In the third embodiment, the configuration of a connection member 902B serving as an example of a conductive member is different from the connection member 902 of the first embodiment and the second embodiment. To be noted, the connection structure between the signal lines 111 of the rigid wiring board 101 and the signal lines 212 of the flexible wiring board 200A and the connection structure between the ground line 120 of the rigid wiring board 101 and the ground lines 220 and the flexible wiring board 200A are similar to the second embodiment. Specifically, the plurality of signal lines 111 of the rigid wiring board 101 and the plurality of signal lines 212 of the flexible wiring board 200A are electrically and mechanically connected to each other via the plurality of signal bonding portions 901A. In addition, the ground line 120 of the rigid wiring board 101 and the plurality ground lines 220 of the flexible wiring board 200A are electrically and mechanically connected to each other via the plurality of ground bonding portions 903A. The signal bonding portions 901A and the ground bonding portions 903A are each formed from a conductive bonding material such as solder.

The connection member 902B is formed in an approximate U shape as viewed in the Z direction. Further, the connection member 902B is disposed so as to be in contact with each of the ground bonding portions 903A. As a result of this, the connection strength between the rigid wiring board 101 and the flexible wiring board 200A is further enhanced.

As described above, according to the third embodiment, the path for the return current flowing from the flexible wiring board 200A to the rigid wiring board 101 is secured by the connection member 902B. As a result of this, the radiated noise from the signal bonding portions 901A serving as connection portions between the flexible wiring board 200A and the rigid wiring board 101 and signal lines 212 near the signal bonding portions 901A can be reduced. In addition, since the radiated noise can be reduced, noise interference in the wireless communication unit 500 illustrated in FIG. 2B can be reduced, and thus wireless communication can be stably performed in the wireless communication unit 500.

Fourth Embodiment

Figure 11A:
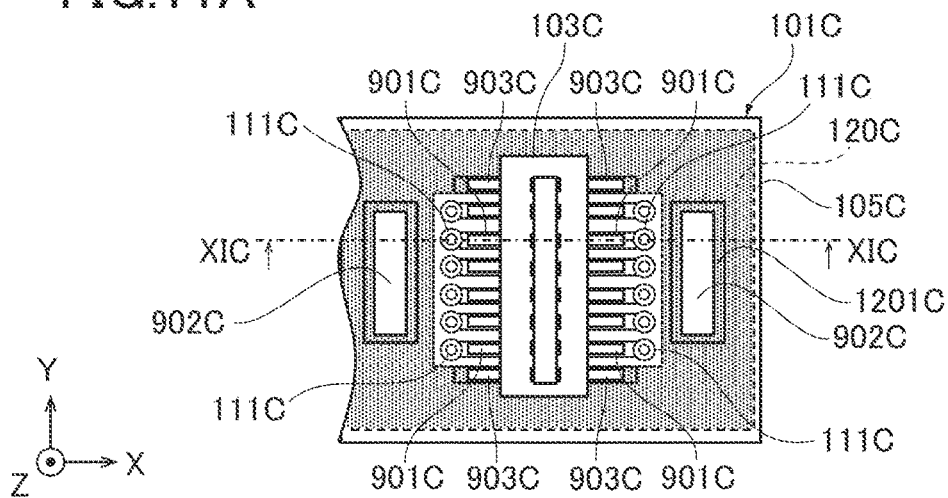
FIG. 11A is a plan view of part of a rigid wiring board and a connection structure according to a fourth embodiment.
Figure 11B:
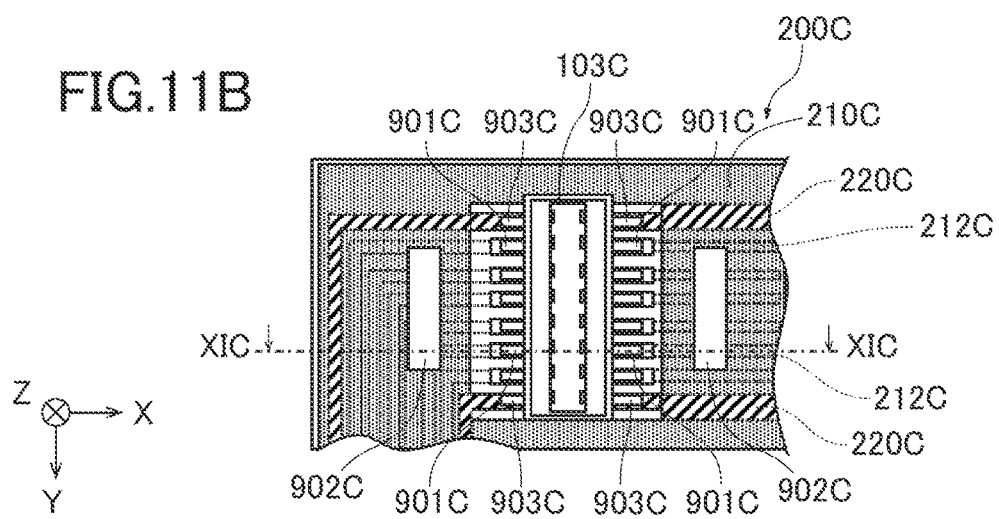
FIG. 11B is a plan view of part of a flexible wiring board and the connection structure according to the fourth embodiment.
Figure 11C:
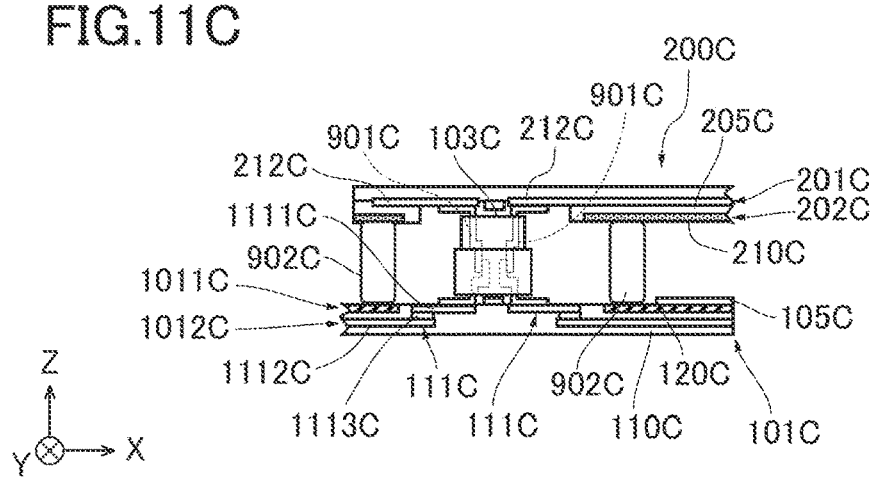
FIG. 11C is a section view of the rigid wiring board, the flexible wiring board, and the connection structure according to the fourth embodiment.

A fourth embodiment will be described. Although a case where the at least one conductive member is the one connection member 902 or 902B has been described in the first to third embodiments described above, the configuration is not limited to this. In some cases, it is more preferable that the at least one conductive member includes a plurality of conductive members depending on the wiring structure of the first wiring board and the second wiring board. FIG. 11A is a plan view of part of a rigid wiring board 101C and a connection structure according to the fourth embodiment. FIG. 11B is a plan view of part of a flexible wiring board 200C and the connection structure according to the fourth embodiment FIG. 11C is a section view of the rigid wiring board 101C, the flexible wiring board 200C, and the connection structure according to the fourth embodiment FIG. 11C schematically illustrates a cross-section taken along a line XIC-XIC in FIGS. 11A and 11B. In the fourth embodiment, elements similar to the first to third embodiments are denoted by the same reference signs, and detailed description thereof will be omitted.

In a communication module of the fourth embodiment, the rigid wiring board 101 and the flexible wiring board 200 illustrated in FIG. 2B are replaced by the rigid wiring board 101C and the flexible wiring board 200C illustrated in FIGS. 11A to 11C. The rigid wiring board 101C of the fourth embodiment serves as an example of a first wiring board, and is a rigid printed wiring board. The flexible wiring board 200C of the fourth embodiment serves as an example of a second wiring board, and is a flexible printed wiring board. The rigid wiring board 101C and the flexible wiring board 200C are interconnected by a connector 103C. A differential signal that is a digital signal from the image sensor 102 mounted on the rigid wiring board 101C is transmitted to the flexible wiring board 200C.

The rigid wiring board 101C includes a plurality of signal lines 111C provided on both sides of a connector 103C. The signal lines 111C each serve as an example of a first signal line. FIG. 11A illustrates twelve signal lines 111C in total as the plurality of signal lines 111C. The twelve signal lines 111C constitute six differential wire pairs. The twelve signal lines 111C are constituted by six signal lines 111C provided on a first side of the connector 103C, and six signal lines 111C provided on a second side of the connector 103C opposite to the first side.

Although the rigid wiring board 101C of the fourth embodiment is different from the rigid wiring board 101 of the first embodiment described above in the number of the signal lines 111C and the wiring structure thereof the other elements of the rigid wiring board 101C are approximately the same as those of the rigid wiring board 101 of the first embodiment. The rigid wiring board 101C includes at least two conductor layers 1011C and 1012C. The conductor layers 1011C and 1012C are arranged to oppose each other in the Z direction with an insulator 110C that is an insulating substrate therebetween. The signal lines 111C are provided to bridge the two conductor layers 1011C and 1012C. A ground line 120C serves as an example of a first ground line, and is provided in the conductor layer 1011C.

The flexible wiring board 200C includes a plurality of signal lines 212C provided on both sides of a connector 103C, a plurality of ground lines 220C provided on both sides of the connector 103C, and a shielding member 210C disposed to avoid the connector 103C. The ground lines 220C each serve as an example of a second ground line. FIG. 11B illustrates twelve signal lines 212C in total as the plurality of signal lines 212C. The twelve signal lines 212C constitute six differential wire pairs. The twelve signal lines 212C are constituted by six signal lines 212C provided on a first side of the connector 103C, and six signal lines 212C provided on a second side of the connector 103C opposite to the first side.

Although the flexible wiring board 200C of the fourth embodiment is different from the flexible wiring board 200 of the first embodiment described above in the number of the signal lines 212C and the wiring structure thereof, the other elements of the flexible wiring board 200C are approximately the same as those of the flexible wiring board 200 of the first embodiment. The flexible wiring board 200C is a two-layer flexible printed wiring board including conductor layers 201C and 202C arranged to oppose each other in the Z direction with an insulator 205C similarly to the first embodiment. The conductor layer 201C serves as an example of a first layer, and the conductor layer 202C serves as an example of a second layer different from the first layer. The signal lines 212C and the ground lines 220C are disposed in the conductor layer 201C, and the shielding member 210C is disposed in the conductor layer 202C.

The connector 103C includes a plurality of signal terminals 901C electrically interconnecting the plurality of signal lines 111C and the plurality of signal lines 212C. The signal terminals 901C each serve as an example of a first connection member. In addition, the connector 103C includes a plurality of ground terminals 903C that electrically interconnect the ground line 120C and the plurality of ground lines 220C. The ground terminals 903C each serve as an example of a ground connection member and an example of a second connection member.

In the fourth embodiment, two connection members 902C are provided between the rigid wiring board 101C and the flexible wiring board 200C for the twelve signal lines 212C. The two connection members 902C each serve as an example of a conductive member. The material of each of the connection members 902C is a conductive material, that is, metal. The connection members 902C each interconnect the shielding member 210C of the flexible wiring board 200C and the ground line 120C of the rigid wiring board 101C. The connection members 902C are connected to a portion 1201C of the ground line 120C exposed through an opening portion provided in a solder resist 105C of the rigid wiring board 101C.

One of the two connection members 902C is provided in correspondence with the six signal lines 212C provided on the first side of the connector 103C. In addition, the other of the two connection members 902C is provided in correspondence with the six signal lines 212C provided on the second side of the connector 103C. The connection members 902C are each provided so as to partially overlap with at least one signal line 212C among the six signal lines 212C as viewed in the Z direction.

The plurality of signal lines 111C each include a conductor pattern 1111C serving as an example of a first conductor pattern disposed in the conductor layer 1011C, and a conductor pattern 1112C serving as an example of a second conductor pattern disposed in the conductor layer 1012C. In addition, the plurality of signal lines 111C each include a via conductor 1113C electrically interconnecting the conductor pattern 1111C and the conductor pattern 1112C. The conductor patterns 1111C are respectively in contact with the signal terminals 901C. According to the configuration described above, the signal lines 111C are provided so as not to interfere with the ground line 120C disposed in the conductor layer 1012C.

As described above, according to the fourth embodiment, the path for the return current flowing from the flexible wiring board 200C to the rigid wiring board 101C is secured by the plurality of connection members 902C. As a result of this, the radiated noise from the connector 103C serving as a connection portion between the flexible wiring board 200C and the rigid wiring board 101C and signal lines 212C near the connector 103C can be reduced. In addition, since the radiated noise can be reduced, noise interference in the wireless communication unit 500 illustrated in FIG. 2B can be reduced, and thus wireless communication can be stably performed in the wireless communication unit 500.

Modification Example of Fourth Embodiment

Figure 12A:
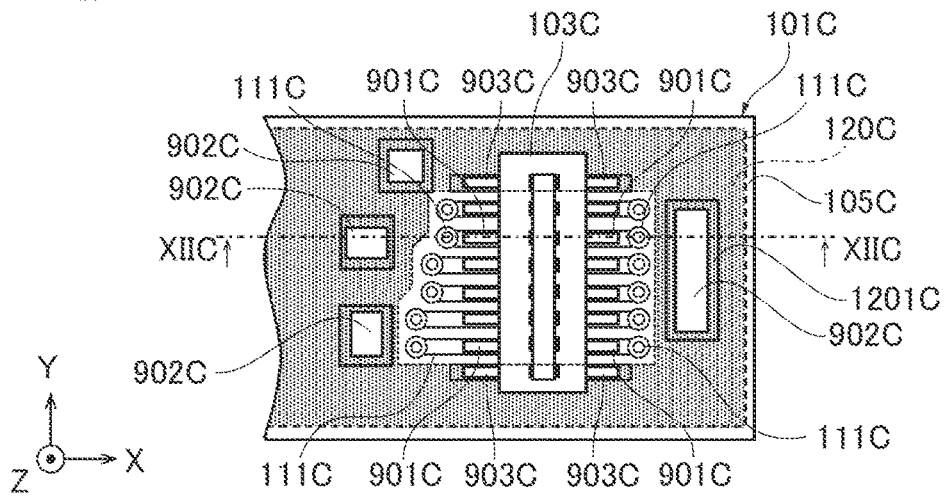
FIG. 12A is a plan view of part of a rigid wiring board and a connection structure according to a modification example.
Figure 12B:
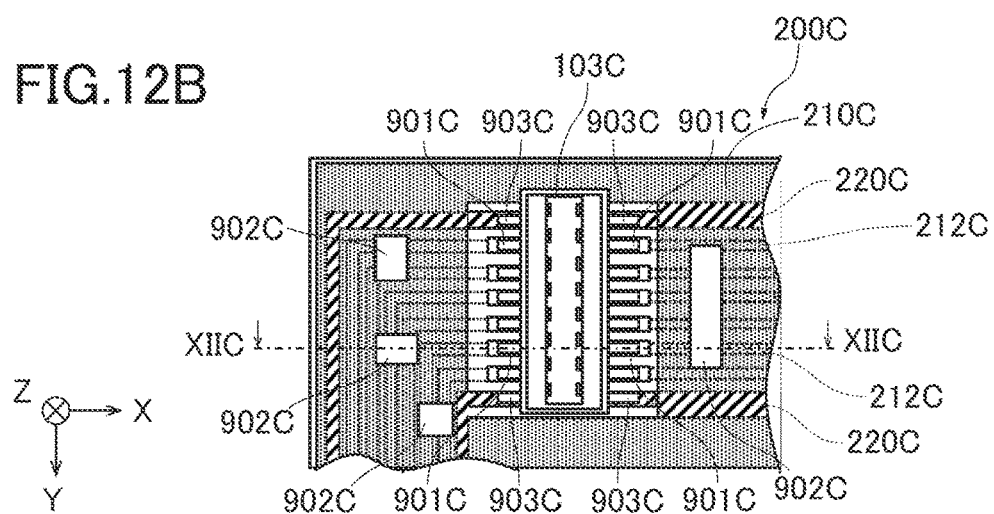
FIG. 12B is a plan view of part of a flexible wiring board and the connection structure according to the modification example.
Figure 12C:
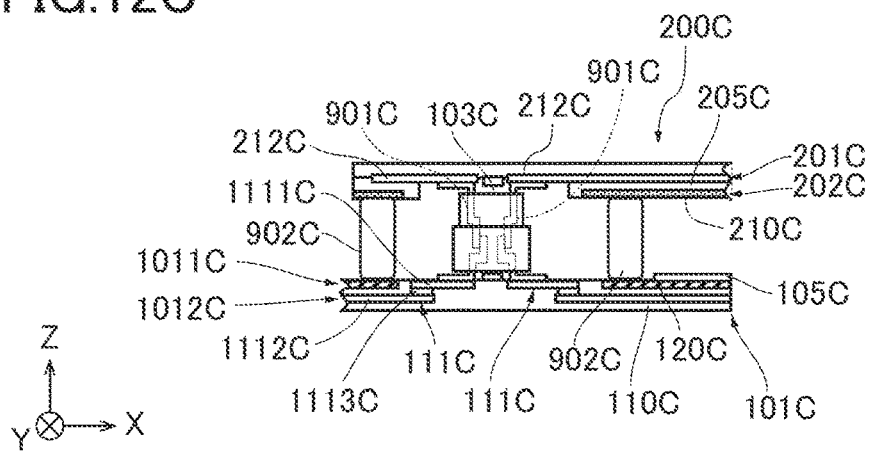
FIG. 12C is a section view of the rigid wiring board, the flexible wiring board, and the connection structure according to the modification example.

FIGS. 12A to 12C illustrate a modification example of the fourth embodiment. FIG. 12A is a plan view of part of the rigid wiring board 101C and a connection structure according to the modification example. FIG. 12B is a plan view of part of the flexible wiring board 200C and the connection structure according to the modification example. FIG. 12C is a section view of the rigid wiring board 101C, the flexible wiring board 200C, and the connection structure according to the modification example. FIG. 12C schematically illustrates a cross-section taken along a line XIIC-XIIC in FIGS. 12A and 12B. In the modification example, elements similar to the fourth embodiment are denoted by the same reference signs, and detailed description thereof will be omitted. Although a case where the plurality of conductive members are the two connection members 902C has been described in the fourth embodiment, the configuration is not limited to this. The plurality of conductive members may be three or more connection members 902C. In this case, the connection members 902C are each preferably provided in the vicinity of the connector 103C.

Fifth Embodiment

Figure 13A:
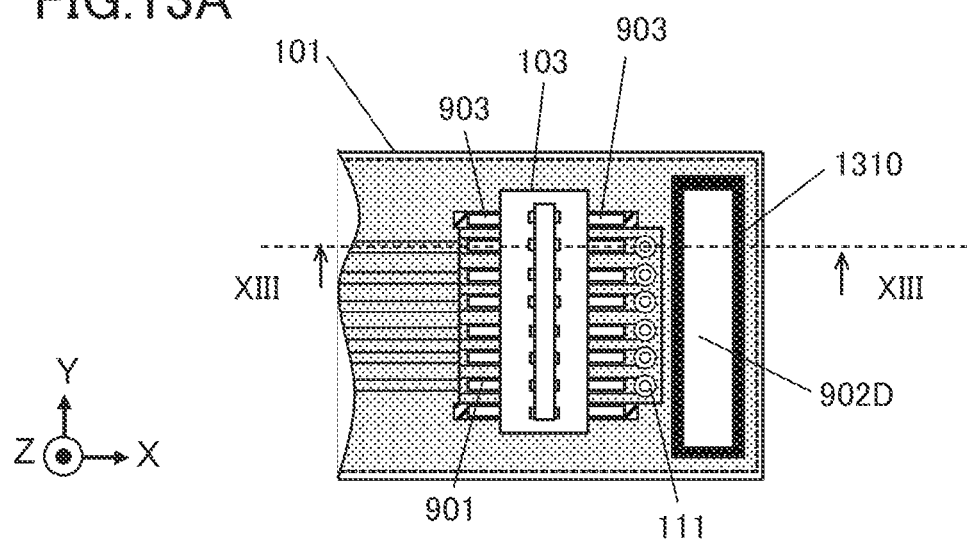
FIG. 13A is a plan view of part of a rigid wiring board and a connection structure according to a fifth embodiment.
Figure 13B:
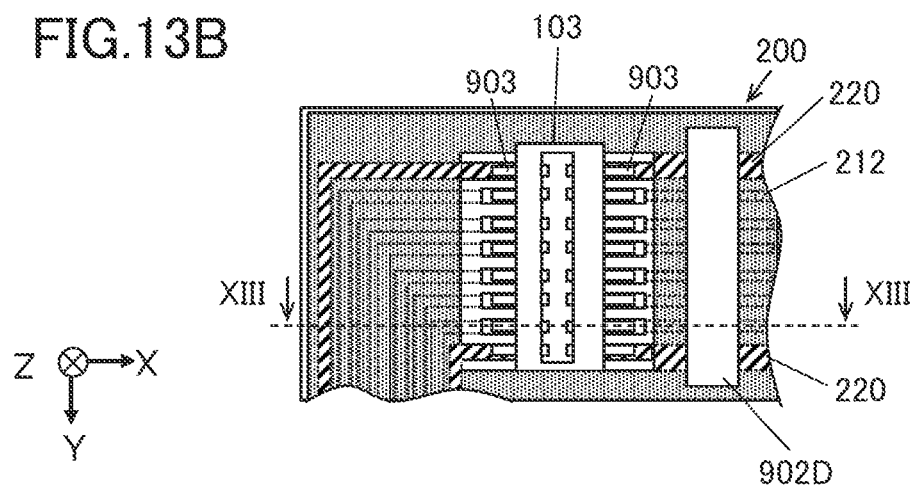
FIG. 13B is a plan view of part of a flexible wiring board and the connection structure according to the fifth embodiment.
Figure 13C:
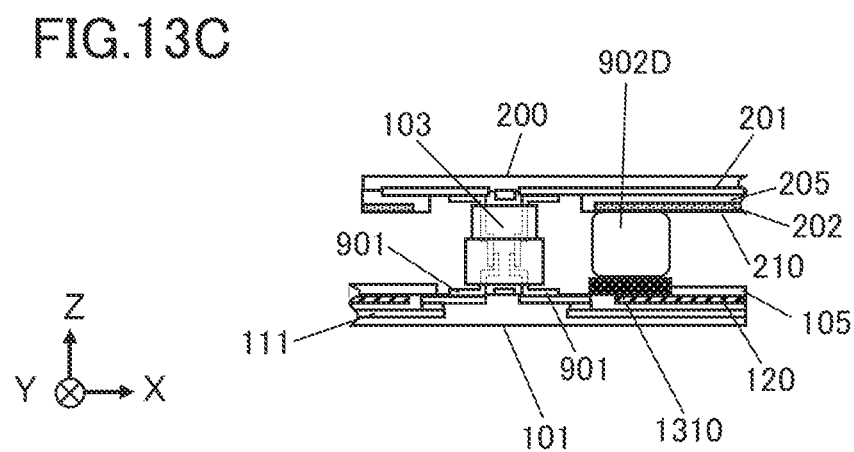
FIG. 13C is a section view of the rigid wiring board, the flexible wiring board, and the connection structure according to the fifth embodiment.

A fifth embodiment will be described. Although a case where the connection member 902 electrically interconnects the ground line 120 of the rigid wiring board 101 and the shielding member 210 of the flexible wiring board 200 has been described in the first embodiment, the form of the connection member 902 is not limited to this. FIG. 13A is a plan view of part of the rigid wiring board 101 and a connection structure according to the fifth embodiment. FIG. 13B is a plan view of part of the flexible wiring board 200 and the connection structure according to the fifth embodiment. FIG. 13C is a section view of the rigid wiring board 101, the flexible wiring board 200, and the connection structure according to the fifth embodiment. FIG. 13C schematically illustrates a cross-section taken along a line XIII-XIII in FIGS. 13A and 13B. In the fifth embodiment, elements similar to the first embodiment are denoted by the same reference signs, and detailed description thereof will be omitted.

The rigid wiring board 101 of the fifth embodiment has a similar configuration to the first embodiment. The flexible wiring board 200 of the fifth embodiment has a similar configuration to the first embodiment. A connection member 902D serving as an example of a conductive member is disposed between the rigid wiring board 101 and the flexible wiring board 200. The material of the connection member 902D is a conductive material, that is, metal.

In the fifth embodiment, the connection member 902D is in contact with the shielding member 210 of the flexible wiring board 200 but is not in contact with the ground line 120 of the rigid wiring board 101. An insulating member 1310 is provided between the connection member 902D and the ground line 120 the rigid wiring board 101. The path of the return current flowing from the flexible wiring board 200 to the rigid wiring board 101 in such a configuration is approximately the same path as in the first embodiment because capacitive coupling between the connection member 902D and the ground line 120 occurs.

The insulating member 1310 is, for example, a polyimide tape. The material of the insulating member 1310 is not particularly limited as long as the insulating member 1310 is electrically insulating. The thickness of the insulating member 1310 in the Z direction is preferably such a thickness that capacitive coupling between the connection member 902D and the ground line 120 is likely to occur. Specifically, the thickness is preferably 0.2 mm or less, and more preferably 0.1 mm or less.

As described above, according to the fifth embodiment, the path for the return current flowing from the flexible wiring board 200 to the rigid wiring board 101 is secured by the connection member 902D and the insulating member 1310. As a result of this, the radiated noise from the signal terminals 901 serving as connection portions between the flexible wiring board 200 and the rigid wiring board 101 and signal lines 212 near the signal terminals 901 can be reduced. In addition, since the radiated noise can be reduced, noise interference in the wireless communication unit 500 illustrated in FIG. 2B can be reduced, and thus wireless communication can be stably performed in the wireless communication unit 500.

To be noted, the insulating member 1310 may be provided between the connection member 902D and the shielding member 210 of the flexible wiring board 200 instead of between the connection member 902D and the ground line 120. In addition, two insulating members 1310 may be respectively provided between the connection member 902D and the ground line 120 and between the connection member 902D and the shielding member 210.

EXAMPLE 2

Figure 14:
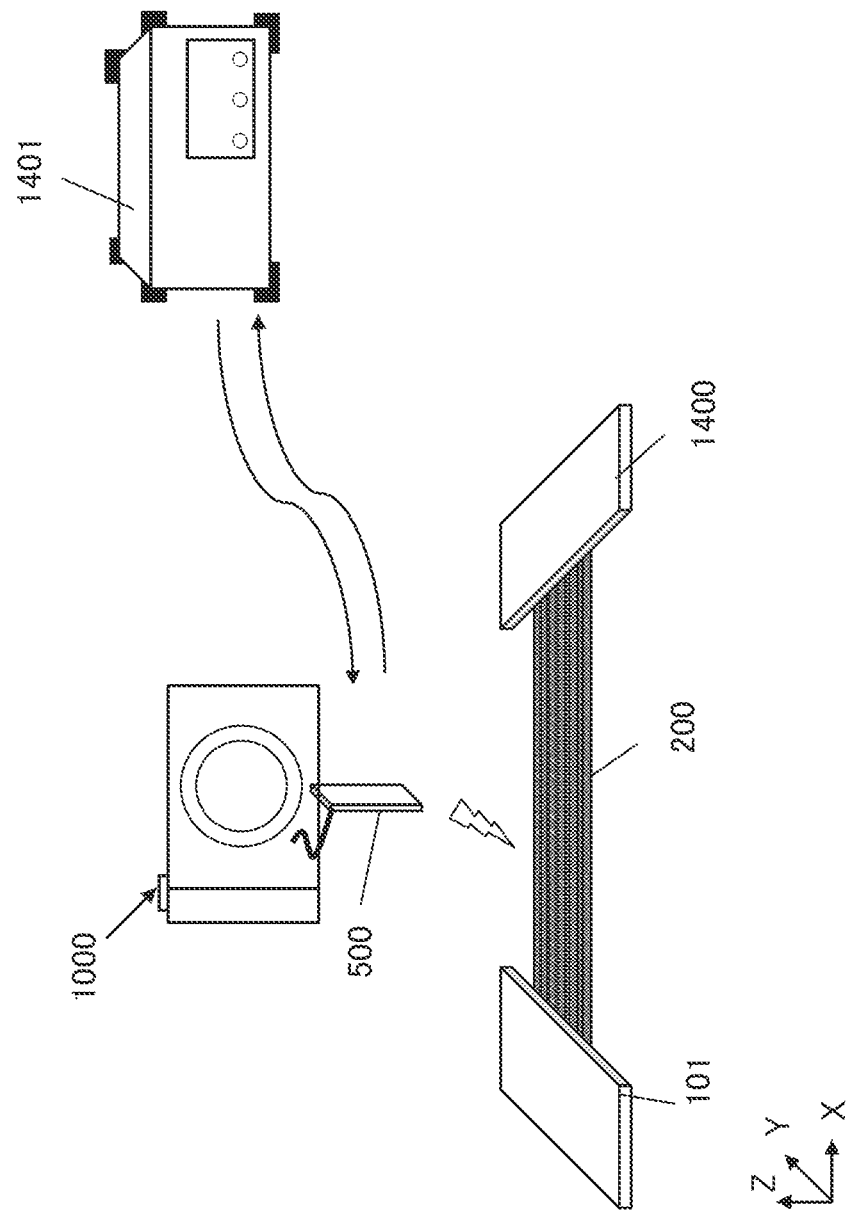
FIG. 14 is a schematic diagram illustrating a measurement system that measures reception sensitivity of Example 2.
Figure 15A:
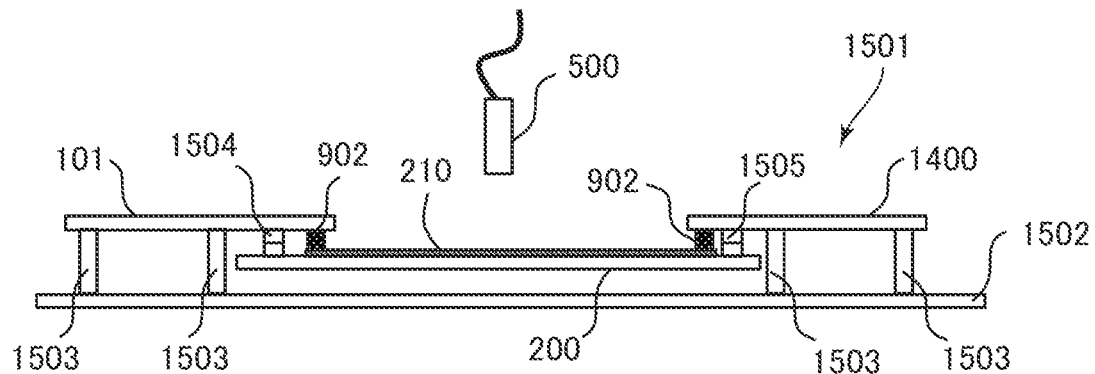
FIG. 15A is a schematic diagram illustrating the measurement system that measures reception sensitivity of Example 2.
Figure 15A:
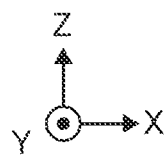
Figure 15B:
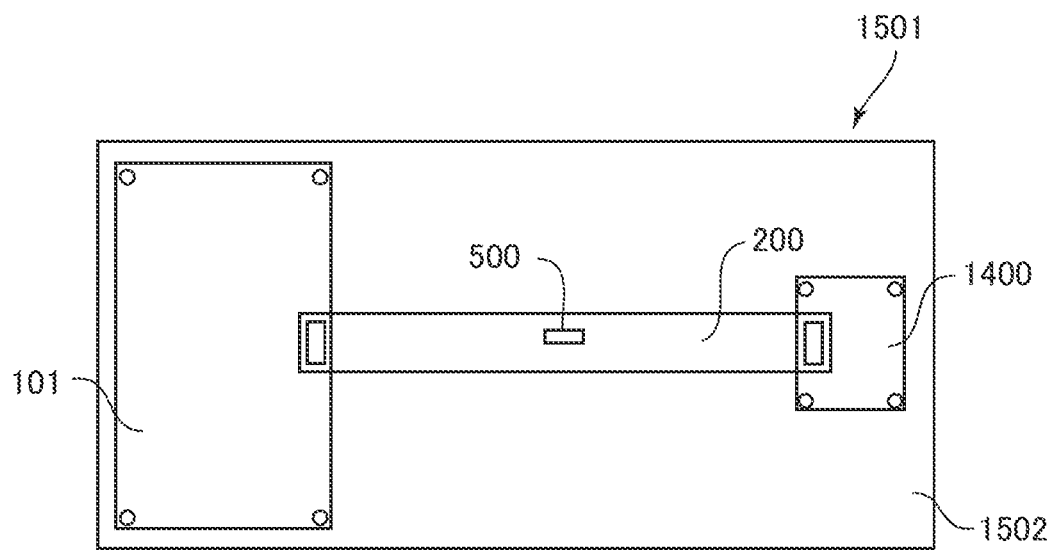
FIG. 15B is a schematic diagram illustrating the measurement system that measures reception sensitivity of Example 2.
Figure 15B:
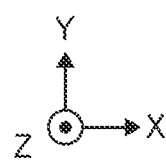

In Example 2, the noise interference amount of the wireless communication unit 500 incorporated in a digital camera serving as the image pickup apparatus 1000 was measured on the basis of the simulation performed in Example 1. FIGS. 14, 15A, and 15B are each a schematic diagram illustrating a measurement system that measured the reception sensitivity in Example 2. The reception sensitivity was measured by calculating the ratio between the number of packets transmitted from an evaluation apparatus and the number of packets received by the wireless communication unit 500 by using a transmission/reception characteristic measurement device 1401 (MT8862A manufactured by Anritsu).

FIG. 14 illustrates the wireless communication unit 500, the rigid wiring board 101, and the flexible wiring board 200 that are part of the image pickup apparatus 1000, and the transmission/reception characteristic measurement device 1401. The rigid wiring board 101 is connected to a first end of the flexible wiring board 200, and a rigid wiring board 1400 is connected to a second end of the flexible wiring board 200. The wireless communication unit 500 was moved close to the flexible wiring board 200, and the reception sensitivity to a noise that interfered with the wireless communication unit 500 among noises radiated from the flexible wiring board 200 was measured.

The measurement conditions will be described in more detail. FIG. 15A is a side view of part of an electronic module 1501 of Example 2, and FIG. 15B is a plan view of part of the electronic module 1501 of Example 2. As illustrated in FIGS. 15A and 15B, the flexible wiring board 200 was made extending flat in the X direction. The rigid wiring board 101 and the rigid wiring board 1400 were fixed to one surface of a metal frame 1502 via metal members 1503.

The outer dimensions of the rigid wiring board 101 were set to a length in the X direction of 129.0 mm, a length in the Y direction of 210.0 mm, and a thickness in the Z direction of 1.6 mm. The rigid wiring board 101 was formed as a six-layer substrate. 20 ICs (THCV215 manufactured by Thine) that output differential signals were mounted on the rigid wiring board 101. The outer dimensions of the flexible wiring board 200 were set to a length in the X direction of 144.0 mm, a length in the Y direction of 27.0 mm, and a thickness in the Z direction of 37.5 The flexible wiring board 200 was formed as a substrate in which signal lines were disposed in a single layer. The shielding member 210 formed from silver was provided on the entirety of one surface of the flexible wiring board 200 by shield printing. As a connector 1504 interconnecting the flexible wiring board 200 and the rigid wiring board 101, DF40C-70DS-0.4V [51] and DF40C-70DP-0.4V [51] manufactured by HIROSE ELECTRIC CO., LTD. was used.

As the connection member 902 interconnecting the shielding member 210 and the rigid wiring board 101, E02S020015RT-450 manufactured by SEIWA ELECTRIC MFG. CO., LTD. was used. A ground line was disposed in each of the two ends and the center of the flexible wiring board 200 in the Y direction, which was the width direction, and ten differential wire pairs were disposed on each side in the Y direction of the ground line disposed at the center.

The outer dimensions of the rigid wiring board 1400 were set to a length in the X direction of 50.0 mm, a length in the Y direction of 70.0 mm, and a thickness in the Z direction of 1.6 mm. The rigid wiring board 1400 was formed as a six-layer substrate.

As a connector 1505 interconnecting the flexible wiring board 200 and the rigid wiring board 1400, DF40C-70DS-0.4V [51] and DF40C-70DP-0.4V [51] manufactured by HIROSE ELECTRIC CO., LTD. was used.

The two signal lines included in each differential wire pair provided in the rigid wiring board 1400 were terminated by a 100Ω resistor. The rigid wiring boards 101 and 1400 were electrically connected to the metal frame 1502 via metal members 1503 each having a height of 15.0 mm and a diameter of 6 mm. The metal frame 1502 was constituted by a metal plate having a length in the X direction of 325 mm, a length in the Y direction of 250 mm, and a thickness in the Z direction of 1.0 mm. To measure the electromagnetic noise radiated from the flexible wiring board 200, the wireless communication unit 500 was disposed at a height of 5 mm from the center of the flexible wiring board 200.

The frequency of the differential signal was set to 2.65 GHz. In the rigid wiring board 101, 20 differential wire pairs each constituted by two signal lines were provided. When a differential signal was output to the flexible wiring board 200, an electromagnetic noise derived from a common mode current was detected in the frequency band from 1 GHz to 6 GHz.

Figure 16:
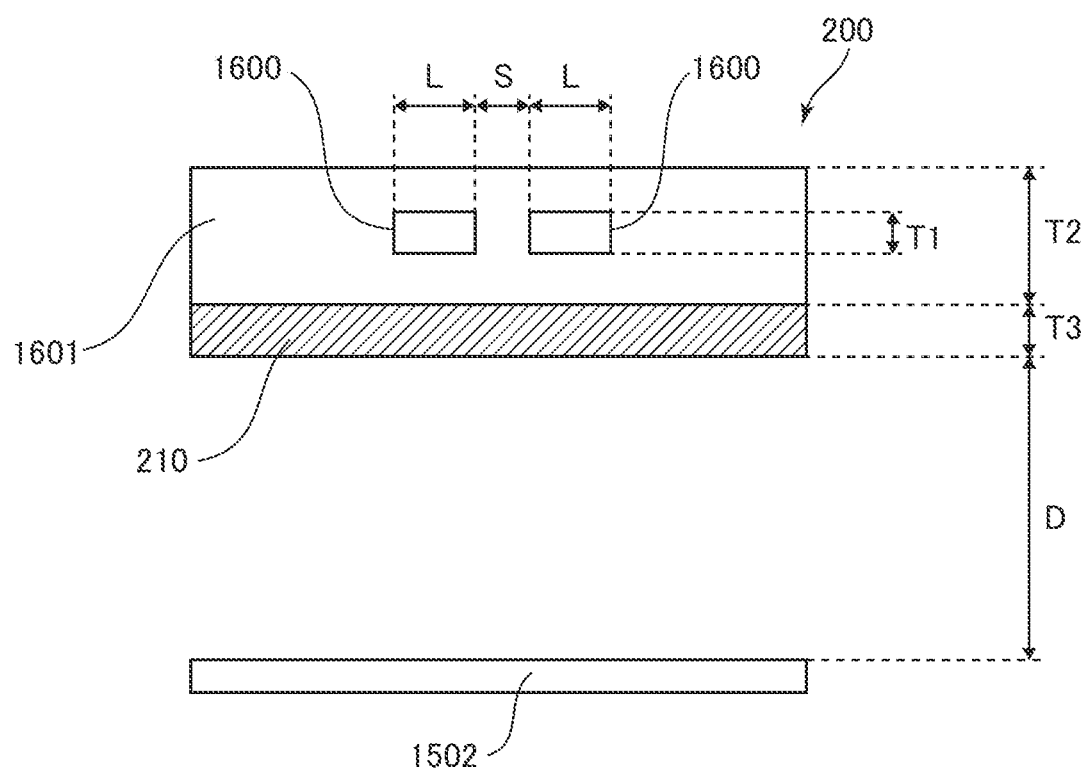
FIG. 16 is a section view of a flexible wiring board of Example 2 illustrating a structure thereof.
Figure 17A:
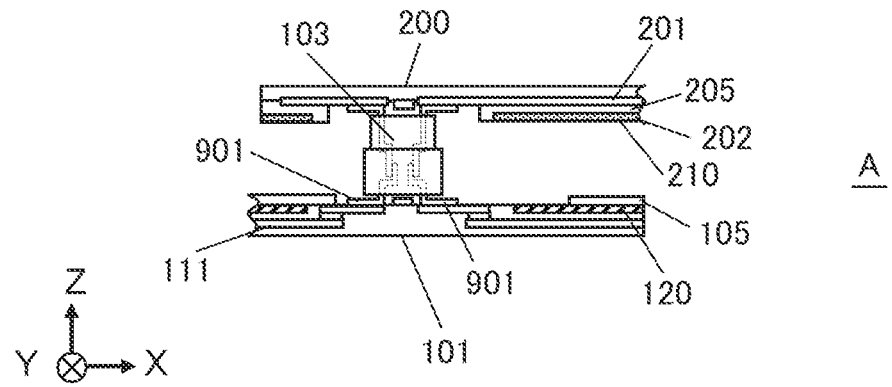
FIG. 17A is a schematic diagram for describing measurement conditions of Example 2.
Figure 17B:
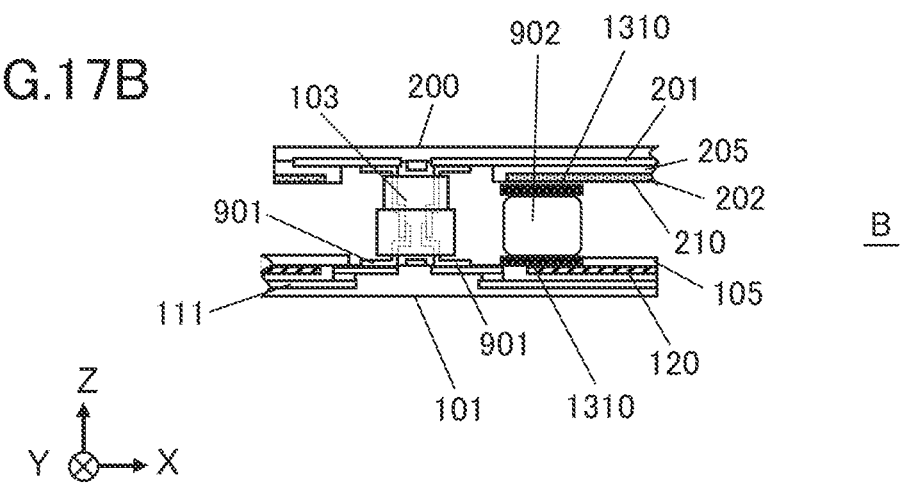
FIG. 17B is a schematic diagram for describing measurement conditions of Example 2.
Figure 17C:
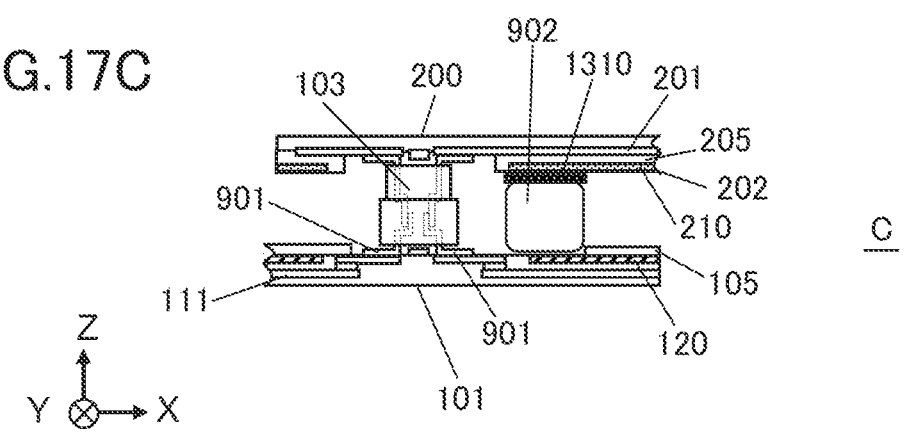
FIG. 17C is a schematic diagram for describing measurement conditions of Example 2.
Figure 18A:
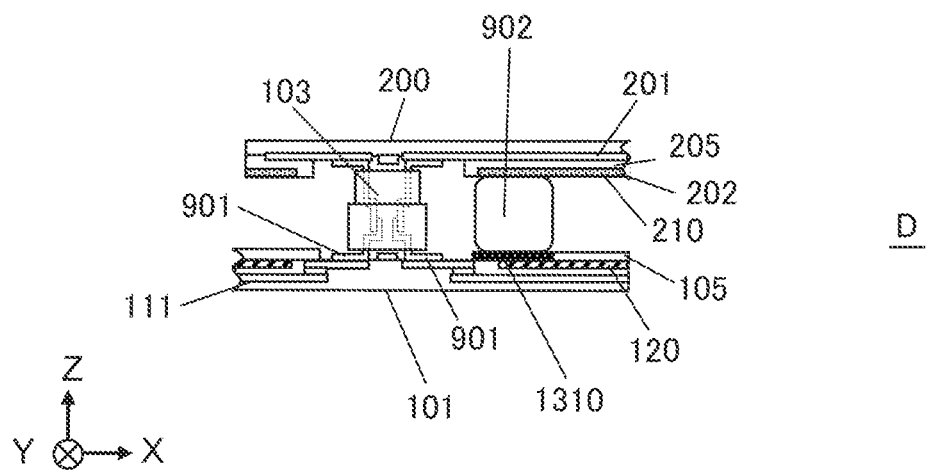
FIG. 18A is a schematic diagram for describing measurement conditions of Example 2.
Figure 18B:
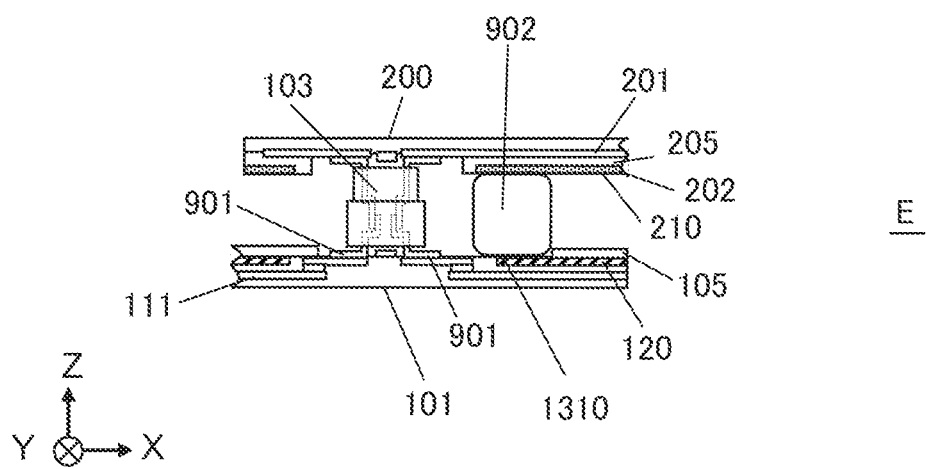
FIG. 18B is a schematic diagram for describing measurement conditions of Example 2.

FIG. 16 is a schematic diagram illustrating a section structure of the flexible wiring board 200 of Example 2. Signal lines 1600 were formed from copper. An insulating member 1601 was formed from polyimide. A wire width L of each of the signal lines 1600 was set to 55 μm, a distance S between two signal lines 1600 of a differential wire pair was set to 140 μm, a thickness T1 of each of the signal lines 1600 was set to 6 μm, and a thickness T2 of the insulating member 1601 was set to 37.5 μm. In addition, a thickness T3 of the shielding member 210 was set to 5 μm, and a distance D between the shielding member 210 and the metal frame 1502 was set to 15.0 mm. The relative permittivity of the polyimide was 3.38.

Figure 19:
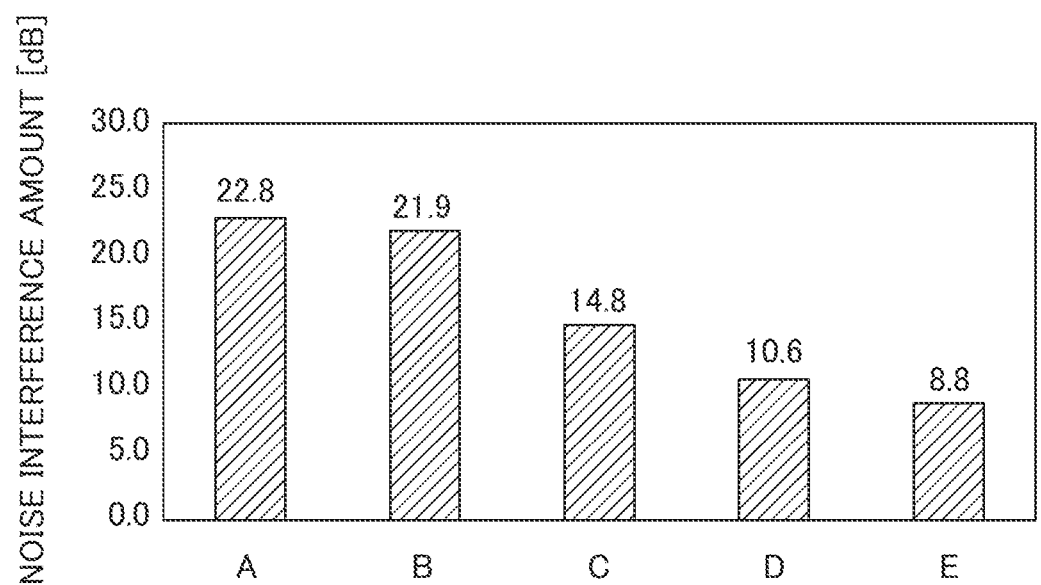
FIG. 19 is a graph illustrating a result of measuring an interference amount of an electric field noise of Example 2.

The radiated noise was measured in four conditions. FIGS. 17A to 18B are schematic diagrams illustrating measurement conditions in Example 2. A condition in which the connection member 902 was not provided will be referred to as a structure A. A condition in which the connection member 902 was in contact with neither of the ground line 120 and the shielding member 210 will be referred to as a structure B. A condition in which the connection member 902 was in contact with the ground line 120 but not in contact with the shielding member 210 will be referred to as a structure C. A condition in which the connection member 902 was in contact with the shielding member 210 but not in contact with the ground line 120 will be referred to as a structure. D. A condition in which the connection member 902 was in contact with both the ground line 120 and the shielding member 210 will be referred to as a structure E. In the structures B, C, and D, a polyimide tape having a thickness of 0.1 mm was used as the insulating member 1310. The amount of noise interference was measured for each of the structures A to E. FIG. 19 illustrates the results. FIG. 19 is a graph indicating the interference amount of an electromagnetic noise at 5.3 GHz, which is the frequency of the wireless LAN. To be noted, the interference amount is a value obtained by subtracting the reception sensitivity that has decreased due to interference with a noise from the reception sensitivity not affected by the noise.

As can be seen from FIG. 19, the noise interference amount decreased in the structures B to E as compared with the structure A serving as a comparative example. It was found out that particularly the structure E has the highest effect of reducing the noise interference amount. In addition, it was found out that the effect of reducing the noise interference amount was high enough in the structures C and D with respect to the structures A and B.

The present invention is not limited to the embodiments described above, and can be modified in many ways within the technical concept of the present invention. In addition, the effects described in the embodiments are merely enumeration of the most preferable effects that can be obtained from the present invention, and the effect of the present invention is not limited to those described in the embodiments.

Although it is preferable that a conductive member is provided on a first wiring board provided on the transmission side of a digital signal as described in the first to fifth embodiments described above, the configuration is not limited to this. A conductive member may be provided on a first wiring board provided on the reception side of the digital signal. For example, in the example of the first embodiment, the connection member 902 serving as an example of a conductive member may be provided between the rigid wiring board 301 and the flexible wiring board 200. In addition, a conductive member may be provided on both a first wiring board provided on the transmission side of the digital signal and a first wiring board provided on the reception side of the digital signal.

In addition, a case where the electronic part that transmits a digital signal is an image sensor 102 has been described in the first to fifth embodiments. That is, since the image sensor 102 transmits image data of a large data size, many signal lines 111 are provided. Therefore, although it is preferable to dispose a conductive member between the rigid wiring board on which the image sensor 102 is provided and the flexible wiring board from the viewpoint of securing the path for the return current, the configuration is not limited to this. A conductive member may be provided between a first wiring board on which an electronic part different from the image sensor 102 is mounted and a second wiring board.

In addition, although the number of the signal lines 111 is set to 6 in the first to fifth embodiments, the number of the signal lines 111 is not limited to this. The present invention is also applicable to a case with a larger number of signal lines, particularly to a case where the number of signal lines is 20 or more.

In addition, although a case where the electronic device is the image pickup apparatus 1000 has been described in the first to fifth embodiments, the configuration is not limited to this. The present invention is also applicable to an electronic device different from an image pickup apparatus. In this case, the electronic device preferably includes a wireless communication unit capable of wirelessly communicating with an external device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-25057, filed Feb. 19, 2021, and Japanese Patent Application No. 2022-10621, filed Jan. 27, 2022, which are hereby incorporated by reference herein in their entirety.

Wat is claimed is:

1. A communication module comprising:
    a first wiring board including a plurality of first signal lines and a first ground line;
    a second wiring board including a first layer and a second layer, the first layer including a plurality of second signal lines, the second layer including a shielding member;
    a plurality of first connection members via which the plurality of first signal lines are electrically connected to the plurality of second signal lines; and
    at least one conductive member provided between the first ground line and the shielding member,
    wherein the at least one conductive member is provided so as to overlap with at least one second signal line among the plurality of second signal lines as viewed in a direction perpendicular to a main surface of the first wiring board.

2. The communication module according to claim 1, wherein the at least one conductive member is electrically connected to at least one of the first ground line and the shielding member.

3. The communication module according to claim 1, wherein the at least one conductive member is electrically connected to the first ground line and the shielding member.

4. The communication module according to claim 1, wherein an insulator is interposed between the first layer and the second layer.

5. The communication module according to claim 1, wherein the at least one second signal line includes 20 or more second signal lines.

6. The communication module according to claim 1,
wherein the plurality of second signal lines are arranged at intervals in a predetermined direction, and
wherein, as viewed in the direction perpendicular to the main surface of the first wiring board, a ratio of a total length of part of the plurality of second signal lines overlapping with the at least one conductive member to a total length of the plurality of second signal lines is ⅗ or higher and 1 or lower in the predetermined direction.

7. The communication module according to claim 1,
wherein the plurality of second signal lines are arranged at intervals in a predetermined direction, and
wherein, as viewed in the direction perpendicular to the main surface of the first wiring board, a ratio of a total number of second signal lines overlapping with the at least one conductive member among the plurality of second signal lines to a total number of the plurality of second signal lines is ⅗ or higher and 1 or lower.

8. The communication module according to claim 1,
wherein the first layer of the second wiring board includes a second ground line, and
wherein the communication module further comprises a second connection member configured to electrically interconnect the first ground line of the first wiring board and the second ground line of the second wiring board.

9. The communication module according to claim 8, wherein the at least one conductive member is provided in contact with the second connection member.

10. The communication module according to claim 1, wherein the at least one conductive member includes a plurality of conductive members.

11. The communication module according to claim 1,
wherein the first wiring board is a rigid wiring board, and
wherein the second wiring board is a flexible wiring board.

12. The communication module according to claim 1, wherein the second wiring board is detachably connected to the first wiring board via the plurality of first connection members.

13. The communication module according to claim 1, wherein the plurality of first signal lines are respectively connected to the plurality of second signal lines via the plurality of first connection members.

14. The communication module according to claim 1, wherein the plurality of first signal lines each include a first conductor pattern in contact with corresponding one of the plurality of first connection members.

15. The communication module according to claim 14, wherein the plurality of first signal lines each include a second conductor pattern electrically connected to the first conductor pattern via a via conductor.

16. The communication module according to claim 1, further comprising an electronic part mounted on the first wiring board and electrically connected to the plurality of first signal lines.

17. The communication module according to claim 16, wherein the electronic part is configured to transmit a signal to each of the plurality of first signal lines.

18. The communication module according to claim 17, wherein the electronic part is configured to transmit a differential signal as the signal to two first signal lines among the plurality of first signal lines.

19. An electronic device comprising:
a casing;
a wireless communication unit disposed inside the casing and configured to wirelessly communicate with an external device; and
the communication module according to claim 1 disposed inside the casing.

20. An electronic device comprising:
a casing;
a wireless communication unit disposed inside the casing and configured to wirelessly communicate with an external device; and
the communication module according to claim 16 disposed inside the casing,
wherein the electronic part of the communication module is an image sensor.

* * * * *